(12) United States Patent
Huang et al.

(10) Patent No.: US 10,326,047 B2
(45) Date of Patent: Jun. 18, 2019

(54) LIGHT EMITTING DIODE AND MANUFACTURE METHOD THEREOF

(71) Applicant: Genesis Photonics Inc., Tainan (TW)

(72) Inventors: Tsung-Syun Huang, Tainan (TW); Jing-En Huang, Tainan (TW); Yu-Chen Kuo, Tainan (TW); Yan-Ting Lan, Tainan (TW); Kai-Shun Kang, Tainan (TW); Fei-Lung Lu, Tainan (TW); Teng-Hsien Lai, Tainan (TW); Yi-Ru Huang, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 15/255,161

(22) Filed: Sep. 2, 2016

(65) Prior Publication Data

US 2017/0062653 A1    Mar. 2, 2017

Related U.S. Application Data

(60) Provisional application No. 62/213,592, filed on Sep. 2, 2015.

(51) Int. Cl.
*H01L 33/06* (2010.01)
*H01L 33/38* (2010.01)
(Continued)

(52) U.S. Cl.
CPC ............ *H01L 33/06* (2013.01); *H01L 33/38* (2013.01); *H01L 33/145* (2013.01); *H01L 33/20* (2013.01); *H01L 2933/0016* (2013.01)

(58) Field of Classification Search
None
See application file for complete search history.

(56) References Cited

U.S. PATENT DOCUMENTS

| 4,112,455 A | 9/1978 | Seliger et al. |
| 5,696,389 A | 12/1997 | Ishikawa et al. |

(Continued)

FOREIGN PATENT DOCUMENTS

| CN | 101331616 | 12/2008 |
| CN | 102237461 | 11/2011 |

(Continued)

OTHER PUBLICATIONS

H. Kim et al., "Electrical, optical, and structural properties of indium-tin-oxide thin films for organic light-emitting devices," Journal of Applied Physics, vol. 86, No. 11, Dec. 1, 1999, pp. 6451-6461.

(Continued)

*Primary Examiner* — Ermias T Woldegeorgis
(74) *Attorney, Agent, or Firm* — JCIPRNET

(57) ABSTRACT

A light-emitting diode including a semiconductor epitaxial layer, a first electrode, and a second electrode is provided. The semiconductor epitaxial layer includes a first-type doped semiconductor layer, a second-type doped semiconductor layer, and a quantum well layer. A recessed portion is formed in the semiconductor epitaxial layer. The recessed portion separates the second-type doped semiconductor layer, the quantum well layer, and a portion of the first-type doped semiconductor layer and defines a first region and a second region on the semiconductor epitaxial layer. The first electrode is located in the first region and electrically connected to at least a portion of the first-type doped semiconductor layer and at least a portion of the second-type doped semiconductor layer. The second electrode is located in the second region and electrically connected to the second-type doped semiconductor layer.

40 Claims, 18 Drawing Sheets

(51) Int. Cl.
*H01L 33/14* (2010.01)
*H01L 33/20* (2010.01)

(56) References Cited

U.S. PATENT DOCUMENTS

| | | | |
|---|---|---|---|
| 8,138,518 B2 | 3/2012 | Tsai et al. | |
| 8,283,692 B2 | 10/2012 | Lim et al. | |
| 8,664,684 B2 | 3/2014 | Schubert | |
| 8,754,438 B2 | 6/2014 | Lin et al. | |
| 8,829,549 B2 | 9/2014 | Huang et al. | |
| 9,006,775 B1 | 4/2015 | Kuo | |
| 9,040,328 B2 | 5/2015 | Lin et al. | |
| 9,196,797 B2 | 11/2015 | Lo et al. | |
| 9,287,461 B2 | 3/2016 | Hsiao et al. | |
| 9,705,045 B2 | 7/2017 | Huang et al. | |
| 2008/0157115 A1 | 7/2008 | Chuang et al. | |
| 2009/0152583 A1 | 6/2009 | Chen et al. | |
| 2010/0072487 A1 | 3/2010 | Tsai et al. | |
| 2010/0167434 A1 | 7/2010 | Fang et al. | |
| 2011/0012152 A1 | 1/2011 | Lim et al. | |
| 2011/0241064 A1* | 10/2011 | Fang | H01L 33/145 257/99 |
| 2011/0278634 A1* | 11/2011 | Na | H01L 33/38 257/99 |
| 2012/0049756 A1 | 3/2012 | Schubert | |
| 2012/0061704 A1 | 3/2012 | Jeong et al. | |
| 2012/0211788 A1 | 8/2012 | Yuh et al. | |
| 2012/0223345 A1 | 9/2012 | Tomoda et al. | |
| 2012/0223355 A1 | 9/2012 | Asakawa et al. | |
| 2012/0228580 A1 | 9/2012 | Wang et al. | |
| 2013/0001508 A1 | 1/2013 | Lin et al. | |
| 2013/0234192 A1 | 9/2013 | Kim et al. | |
| 2013/0292719 A1 | 11/2013 | Lee et al. | |
| 2014/0001434 A1 | 1/2014 | Chen | |
| 2014/0034976 A1 | 2/2014 | Chu et al. | |
| 2014/0159099 A1 | 6/2014 | Wu et al. | |
| 2014/0210054 A1 | 7/2014 | Kosub et al. | |
| 2014/0225150 A1 | 8/2014 | Hsiao et al. | |
| 2014/0231852 A1 | 8/2014 | Suh et al. | |
| 2014/0242738 A1 | 8/2014 | Lin et al. | |
| 2014/0312369 A1 | 10/2014 | Yoon et al. | |
| 2015/0028362 A1 | 1/2015 | Chan et al. | |
| 2015/0086301 A1 | 3/2015 | Rogers et al. | |
| 2015/0091787 A1 | 4/2015 | Ohmae et al. | |
| 2015/0108492 A1* | 4/2015 | Kuo | H01L 33/382 257/76 |
| 2015/0236215 A1 | 8/2015 | Park et al. | |
| 2015/0280065 A1 | 10/2015 | Wada | |
| 2015/0311415 A1 | 10/2015 | Song et al. | |
| 2015/0318443 A1 | 11/2015 | Suh, II et al. | |
| 2016/0111618 A1 | 4/2016 | Shur et al. | |
| 2016/0126413 A1 | 5/2016 | Kim et al. | |
| 2016/0126423 A1 | 5/2016 | Jung et al. | |
| 2016/0141457 A1 | 5/2016 | Ha et al. | |
| 2017/0018472 A1 | 1/2017 | Takamoto et al. | |
| 2017/0092540 A1 | 3/2017 | Rohleder et al. | |
| 2017/0229322 A1 | 8/2017 | Hsu et al. | |
| 2018/0090539 A1 | 3/2018 | Son et al. | |

FOREIGN PATENT DOCUMENTS

| | | | |
|---|---|---|---|
| CN | 102881797 | | 1/2013 |
| CN | 102969414 | | 3/2013 |
| CN | 103579436 | | 2/2014 |
| CN | 104282816 | | 1/2015 |
| CN | 104465920 | | 3/2015 |
| CN | 104471727 | | 3/2015 |
| KR | 20120041646 | | 5/2012 |
| KR | 101169036 | | 7/2012 |
| KR | 20120079327 | A * | 7/2012 |

OTHER PUBLICATIONS

"Office Action of Related U.S. Appl. No. 15/045,488," dated Aug. 10, 2016, p. 1-p. 7.

"Office Action of Related U.S. Appl. No. 15/045,265," dated Aug. 1, 2016, p. 1-p. 13, in which the listed references (Ref. 1-13) were cited.

Kim et al., "Electrical, optical, and structural properties of indium-tin-oxide thin films for organic light-emitting devices", Journal of Applied Physics, vol. 86, Dec. 1, 1999, pp. 6451-6461.

"Office Action of Related, U.S. Appl. No. 15/045,265", dated Aug. 1, 2016, p. 1-p. 13, in which the listed references were cited.

"Office Action of Related, U.S. Appl. No. 15/045,263", dated Jan. 9, 2017, p. 1-p. 20, in which the listed references were cited.

"Office Action of Related, U.S. Appl. No. 15/135,574", dated Jan. 9, 2017, p. 1-p. 21, in which the listed references were cited.

"Office Action of Related, U.S. Appl. No. 15/045,488", dated Oct. 28, 2016, p. 1-p. 9, in which the listed reference was cited.

"Office Action of Related, U.S. Appl. No. 15/045,263", dated Nov. 3, 2017, p. 1-p. 36, in which the listed references were cited.

"Office Action of Related, U.S. Appl. No. 15/680,225", dated Mar. 21, 2018, p. 1-p. 16, in which the listed references were cited.

"Office Action of Related, U.S. Appl. No. 15/135,574", dated Oct. 31, 2017, p. 1-p. 31, in which the listed references were cited.

"Office Action of Related, U.S. Appl. No. 15/644,969", dated Nov. 30, 2017, p. 1-p. 24, in which the listed references were cited.

Office Action of Related U.S. Appl. No. 15/965,999, dated Sep. 27, 2018, pp. 1-15.

"Notice of allowance of Related U.S. Appl. No. 15/680,227", dated Jul. 17, 2018, pp. 1-11.

Office Action of Related U.S. Appl. No. 15/644,969, dated Jul. 6, 2018, pp. 1-22.

"Office Action of China Related Application No. 201610089098.1", dated Feb. 28, 2019, pp. 1-8.

"Office Action of China Related Application No. 201610089271.8", dated Dec. 26, 2018, pp. 1-6.

"Office Action of China Related Application No. 201610255191.5", dated Jan. 11, 2019, pp. 1-7.

* cited by examiner

LIGHT EMITTING DIODE AND MANUFACTURE METHOD THEREOF

CROSS-REFERENCE TO RELATED APPLICATION

The application claims the priority benefit of U.S. provisional application Ser. No. 62/213,592, filed on Sep. 2, 2015. The entirety of the above-mentioned patent application is hereby incorporated by reference herein and made a part of this specification.

BACKGROUND OF THE INVENTION

Field of the Invention

The invention relates to a light-emitting device, and more particularly, to a light-emitting diode (LED) and a manufacturing method thereof.

Description of Related Art

As semiconductor techniques advance, the current light-emitting diode now has characteristics such as high brightness and high color rendering properties. Moreover, the light-emitting diode has advantages such as power saving, small size, low voltage drive, and no mercury, and therefore the light-emitting diode is extensively applied in areas such as display and illumination.

However, at this development stage of the LED, how to increase the luminous efficiency of the LED is one of the focuses in the field of LED. In general, the luminous efficiency of the LED is related to the uniformity of current distribution on the LED surface. Specifically, when a known LED is to be operated, a driving voltage is provided to two electrodes to drive electrons and electron holes to flow between the two electrodes, and to recombine the two in a quantum well layer to emit photons. Since the current (or electron flow) of an external input enters the quantum well layer along the path of smallest resistance, the resistance of the current (or electron flow) is related to the locations of the electrodes. For instance, the current (or electron flow) moves to the portion of the quantum well layer closest to the corresponding electrode from the portion of the electrode closest to the quantum well layer. Due to the above characteristics, the current on the surface of the LED cannot readily achieve uniform distribution, such that the phenomenon of nonuniform current distribution occurs in the light-emitting region. As a result, the overall luminous efficiency of the LED is poor. Therefore, how to solve the issue is an important topic for those skilled in the art.

SUMMARY OF THE INVENTION

The invention provides an LED having higher luminous efficiency.

The LED of the invention includes a semiconductor epitaxial layer, a first electrode, a second electrode, and a substrate. The semiconductor epitaxial layer includes a first-type doped semiconductor layer, a quantum well layer, and a second-type doped semiconductor layer, wherein the quantum well layer is located between the first-type doped semiconductor layer and the second-type doped semiconductor layer. The first electrode is electrically connected to the first-type doped semiconductor layer, wherein the first electrode includes a soldering portion and a branch portion extended from the soldering portion. The second electrode is electrically connected to the second-type doped semiconductor layer. The semiconductor epitaxial layer, the first electrode, and the second electrode are disposed at the same side of the substrate. Non-Ohmic contact is formed at the interface of the soldering portion and the substrate or between the soldering portion and the first-type doped semiconductor layer.

In an embodiment of the invention, the substrate further includes a semiconductor layer and a base. The doping concentration of the semiconductor layer is within the range of $10^{15}$ cm$^{-3}$ to $5 \times 10^{17}$ cm$^{-3}$. The semiconductor layer is located between the first-type doped semiconductor layer and the base, wherein the soldering portion is disposed on the semiconductor layer and non-Ohmic contact is formed at the interface of the soldering portion and the semiconductor layer.

In an embodiment of the invention, the first-type doped semiconductor layer further includes at least one opening, and the at least one opening exposes a portion of the semiconductor layer, wherein the soldering portion is disposed in the at least one opening and disposed on the semiconductor layer.

In an embodiment of the invention, the at least one opening is one opening, the opening is located in the direction from the second electrode to the first electrode, and a portion of the branch portion is disposed in the opening and disposed on the semiconductor layer, wherein non-Ohmic contact is formed at the interface of the portion of the branch portion and the semiconductor layer.

In an embodiment of the invention, the at least one opening is one opening, the opening is located in the direction from the second electrode to the first electrode, and the branch portion is disposed on the first-type doped semiconductor layer.

In an embodiment of the invention, the at least one opening is a plurality of openings, and one of the openings is located in the direction from the second electrode to the first electrode, the other openings are arranged along the extending direction of the branch portion, and the branch portion is disposed in the other openings arranged along the extending direction of the branch portion and disposed on the semiconductor layer, wherein non-Ohmic contact is formed at the interface of the branch portion and the semiconductor layer.

In an embodiment of the invention, the material of the semiconductor layer is aluminum gallium nitride.

In an embodiment of the invention, the doping concentration of the first-type doped semiconductor layer is within the range of $10^{17}$ cm$^{-3}$ to $10^{19}$ cm$^{-3}$.

In an embodiment of the invention, the substrate includes a base, wherein the soldering portion and a portion of the branch portion are disposed on the base, and non-Ohmic contact is formed at the interface of the soldering portion and the base and the interface of the portion of the branch portion and the base.

In an embodiment of the invention, the first-type doped semiconductor layer further includes an opening, the opening exposes a portion of the base, and the opening is located in the direction from the second electrode to the first electrode, wherein the soldering portion and a portion of the branch portion are disposed in the opening.

In an embodiment of the invention, the material of the substrate includes an insulation material.

In an embodiment of the invention, the quantum well layer is disposed on the first-type doped semiconductor layer to expose a portion of the first-type doped semiconductor layer, and the soldering portion and the branch portion are disposed on the portion of the first-type doped semiconductor layer exposed by the quantum well layer.

In an embodiment of the invention, the LED further includes at least one current-blocking layer, and the at least one current-blocking layer is disposed between the soldering portion and the first-type doped semiconductor layer, wherein non-Ohmic contact is formed at the interface of the soldering portion and the at least one current-blocking layer.

In an embodiment of the invention, the at least one current-blocking layer is one current-blocking layer.

In an embodiment of the invention, the soldering portion covers the current-blocking layer, and a portion of the soldering portion is in contact with the first-type doped semiconductor layer.

In an embodiment of the invention, the soldering portion exposes a portion of the current-blocking layer.

In an embodiment of the invention, the at least one current-blocking layer is a plurality of current-blocking layers, one of the current-blocking layers is disposed between the soldering portion and the first-type doped semiconductor layer, the other current-blocking layers are arranged along the extending direction of the branch portion, and the branch portion is disposed on each of the current-blocking layers, wherein non-Ohmic contact is formed at the interface of the branch portion and each of the current-blocking layers.

In an embodiment of the invention, the material of the first electrode includes gold or aluminum, and the material of the current-blocking layer includes nickel, aluminum, platinum, gold, or a combination thereof.

In an embodiment of the invention, the LED further includes a current-blocking layer and a current-spreading layer. The current-blocking layer is disposed on the second-type doped semiconductor layer, and the current-blocking layer includes a main body and an extending portion extended from the main body. The current-spreading layer is disposed on the second-type doped semiconductor layer to cover the current-blocking layer.

In an embodiment of the invention, the semiconductor epitaxial layer, the first electrode, the current-blocking layer, the current-spreading layer, and the second electrode are disposed at the same side of the substrate.

In an embodiment of the invention, the second electrode is electrically connected to the second-type doped semiconductor layer via the current-spreading layer.

The LED of the invention includes the LED above and an insulation layer. The insulation layer covers a portion of the first-type doped semiconductor layer and a portion of the second-type doped semiconductor layer, and a spacing is respectively between the insulation layer and the first electrode and between the insulation layer and the second electrode.

The LED of the invention includes a semiconductor epitaxial layer, a first electrode, and a second electrode. The semiconductor epitaxial layer includes a first-type doped semiconductor layer, a second-type doped semiconductor layer, and a quantum well layer. The quantum well layer is located between the first-type doped semiconductor layer and the second-type doped semiconductor layer. A recessed portion is formed in the semiconductor epitaxial layer. The recessed portion separates the second-type doped semiconductor layer, the quantum well layer, and a portion of the first-type doped semiconductor layer to expose the first-type doped semiconductor layer, and defines a first region and a second region on the semiconductor epitaxial layer. The first region and the second region respectively contain a portion of the second-type doped semiconductor layer, a portion of the quantum well layer, and a portion of the first-type doped semiconductor layer and are connected to each other via the first-type doped semiconductor layer. The first electrode is located in the first region and electrically connected to at least a portion of the first-type doped semiconductor layer and at least a portion of the second-type doped semiconductor layer. The second electrode is located in the second region and electrically connected to the second-type doped semiconductor layer.

In an embodiment of the invention, in the first region, the area of the soldering portion of the first electrode is less than the area of the second-type doped semiconductor layer.

In an embodiment of the invention, the branch portion of the first electrode covers a portion of the upper surface of the second-type doped semiconductor layer, a side surface of the second-type doped semiconductor layer, a side surface of the quantum well layer, and a portion of the upper surface of a portion of the first-type doped semiconductor layer.

In an embodiment of the invention, the LED further includes a current-blocking layer and a current-spreading layer. The current-blocking layer is disposed on the second-type doped semiconductor layer. The current-blocking layer includes a main body and an extending portion extended from the main body. The current-spreading layer is disposed on the second-type doped semiconductor layer to cover the current-blocking layer.

In an embodiment of the invention, the current-blocking layer and the current-spreading layer further contain a first opening. The first opening exposes a portion of the second-type doped semiconductor layer.

In an embodiment of the invention, in the first region, the shape of the cross-section of the first-type doped semiconductor layer, the quantum well layer, and the second-type doped semiconductor layer is a trapezoid.

In an embodiment of the invention, the LED further includes an insulation layer. The insulation layer covers a portion of the first-type doped semiconductor layer, the quantum well layer, and the second-type doped semiconductor layer.

In an embodiment of the invention, the insulation layer respectively has a second opening, a third opening, and at least one fourth opening. The second opening is located in the second region and connected to the first opening. The third opening is located in the first region and exposes a portion of the second-type doped semiconductor layer in the first region, and the at least one fourth opening is arranged along the extending direction of the branch portion of the first electrode.

In an embodiment of the invention, the second electrode is disposed in the second opening and the first opening. The soldering portion of the first electrode is disposed in the third opening, and the branch portion of the first electrode covers a portion of the insulation layer and is extended into the at least one fourth opening.

In an embodiment of the invention, a spacing is between the insulation layer and the second electrode.

A manufacturing method of an LED of the invention includes the following steps: a semiconductor epitaxial layer is formed on a substrate, the semiconductor epitaxial layer includes a first-type doped semiconductor layer, a quantum well layer, and a second-type doped semiconductor layer in order; the semiconductor epitaxial layer is patterned to define a first region and a second region on the semiconductor epitaxial layer, wherein the first region and the second region respectively contain a portion of the second-type doped semiconductor layer, a portion of the quantum well layer, and a portion of the first-type doped semiconductor layer and are connected to each other via the first-type doped semiconductor layer; a first electrode is formed and electrically connected to the first-type doped semiconductor layer and the second-type doped semiconductor layer in the first region; and a second electrode is formed and electrically connected to the second-type doped semiconductor layer in the first region.

In an embodiment of the invention, the first electrode includes a soldering portion and a branch portion extended from the soldering portion, the soldering portion is formed on at least a portion of the second-type doped semiconductor layer, and the branch portion is formed on at least a portion of the first-type doped semiconductor layer.

In an embodiment of the invention, a current-blocking layer and a current-spreading layer are formed and stacked on the second-type doped semiconductor layer of the second region, wherein the current-spreading layer is electrically connected to the second electrode and the second-type doped semiconductor layer.

In an embodiment of the invention, a first opening is formed in the current-blocking layer and the current-spreading layer, wherein the first opening exposes a portion of the second-type doped semiconductor layer.

In an embodiment of the invention, an insulation layer is formed on the semiconductor epitaxial layer and a second opening, a third opening, and at least one fourth opening are formed in the insulation layer, wherein the second electrode passes through the second opening and is electrically connected to the second-type doped semiconductor layer, the soldering portion of the first electrode is electrically connected to the second-type doped semiconductor layer via the third opening, and the branch portion of the first electrode is electrically connected to the first-type doped semiconductor layer via the fourth opening.

Based on the above, in the LED of an embodiment of the invention, non-Ohmic contact is formed at the interface of the soldering portion of the first electrode and the substrate or between the soldering portion of the first electrode and the second-type doped semiconductor layer. As a result, when the LED is in operation, since the resistance at the interface at which non-Ohmic contact is formed is greater, the current (or electron flow) provided by an external driving power supply to the LED less readily passes through the interface at which non-Ohmic contact is forming. Therefore, current (or electron flow) can move toward the branch portion away from the soldering portion of the first electrode, and current (or electron flow) can be uniformly distributed on the surface of the LED after spreading, such that the overall luminous efficiency of the LED is increased. Moreover, in an embodiment of the invention, an insulation layer is formed to provide a gap between the electrodes (first electrode and second electrode) and the insulation layer, and therefore the phenomenon of leakage current at the surface of the LED can be further reduced to increase the luminous efficiency of the LED.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

First Embodiment

Figure 1A:
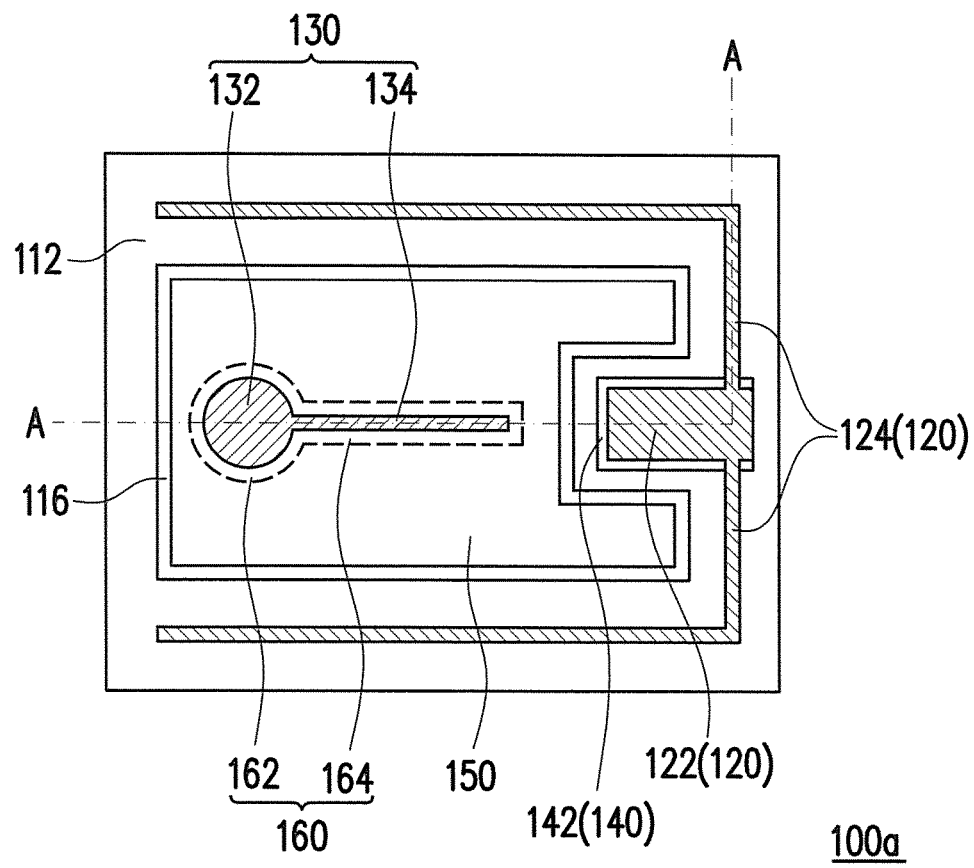
FIG. 1A and FIG. 1B respectively show a top schematic view and a cross-sectional schematic view of the LED of the first embodiment of the invention.
Figure 1B:
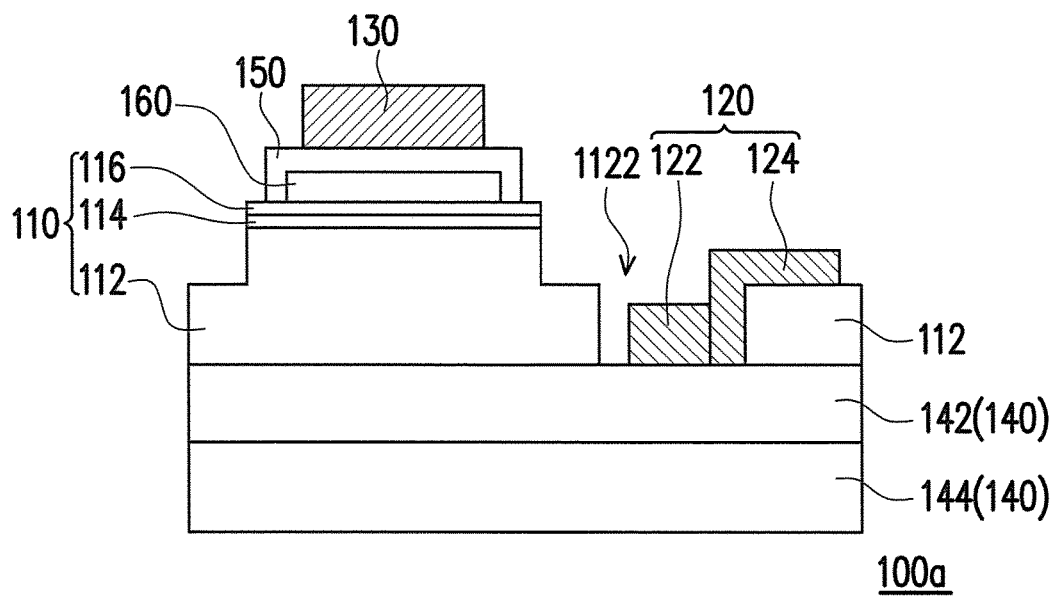

FIG. 1A is a top schematic view of the LED according to the first embodiment of the invention, and FIG. 1B is a cross-sectional schematic view of the LED of the first embodiment of the invention along line A-A.

Referring to both FIG. 1A and FIG. 1B, a LED 100*a* of the present embodiment includes a semiconductor epitaxial layer 110, a first electrode 120, a second electrode 130, and a substrate 140. The semiconductor epitaxial layer 110 includes a first-type doped semiconductor layer 112 (such as an N-type doped semiconductor layer, N—GaN), a quantum well layer 114, and a second-type doped semiconductor layer 116 (such as a P-type doped semiconductor layer, P—GaN), wherein the quantum well layer 114 is located between the first-type doped semiconductor layer 112 and the second-type doped semiconductor layer 116. The first electrode 120 is electrically connected to the first-type doped semiconductor layer 112. The first electrode 120 (such as an N-type electrode) is electrically connected to the first-type doped semiconductor layer 112, wherein the first electrode 120 includes a soldering portion 122 and a branch portion 124 extended from the soldering portion 122, and the soldering portion 122 and the branch portion 124 are, for instance, integrally-formed. The second electrode 130 (such as a P-type electrode) is electrically connected to the second-type doped semiconductor layer 116. The semiconductor epitaxial layer 110, the first electrode 120, and the second electrode 130 are disposed at the same side of the substrate 140. In the present embodiment, non-Ohmic contact is formed at the interface of the soldering portion 122 and the substrate 140. The non-Ohmic contact is, for instance, Schottky contact.

In the present embodiment, the LED 100a further includes a current-spreading layer 150 and a current-blocking layer 160. The current-blocking layer 160 is disposed on the second-type doped semiconductor layer 116, and the current-blocking layer 160 includes a main body 162 and an extending portion 164 extended from the main body 162. Moreover, the current-spreading layer 150 is disposed on the second-type doped semiconductor layer 116 to cover the current-blocking layer 160. Moreover, the second electrode 130 further includes a soldering portion 132 and a finger portion 134 extended from the soldering portion 132, wherein the soldering portion 132 and the finger portion 134 are, for instance, integrally-formed. The soldering portion 132 is located on the main body 162, the finger portion 134 is located above the extending portion 164, and a partial region of the finger portion 134 is not overlapped with the extending portion 164. The number of the finger portion 134 is, for instance, two or more than two. More specifically, the second electrode 130 is electrically connected to the second-type doped semiconductor layer 116 via the current-spreading layer 160. Therefore, the LED 100a of the present embodiment can control the location of the region at which current is concentrated in the LED 100a via the current-spreading layer 150 and the current-blocking layer 160, such that current from the second electrode 130 enters the quantum well layer 114 in a uniform manner, and the luminous efficiency of the LED 100a is increased as a result.

It should be mentioned that, in the present embodiment, the number of the branch portion 124, for instance, is two, and the extending direction of the branch portion 124 is substantially parallel to the edge of the LED 100a. In other embodiments, the number of the branch portion 124 may also be more or less than two, and the direction of extension can also be opposite to the direction of edge inclination of the LED 100a, and the invention is not limited thereto.

Referring further to FIG. 1B, it can be seen from FIG. 1B that, the semiconductor epitaxial layer 110, the first electrode 120, the current-spreading layer 150, and the current-blocking layer 160 in the present embodiment are disposed at the same side of the substrate 140.

In the present embodiment, the first electrode 120 is, for instance, a metal material having good Ohmic contact with the first-type doped semiconductor layer 112, and the second electrode 130 is, for instance, a metal material having good Ohmic contact with the current-spreading layer 150. For instance, the material of the first electrode 120 includes a conductive material such as Cr, Ti, Ni, Pt, Au, or Al, or a stack of any two of the materials, and the material of the second electrode 150 includes a conductive material such as Cr, Ti, Ni, Pt, Au, or Al, or a stack of any two of the materials. Moreover, the material of the current-blocking layer 130 is, for instance, a dielectric layer, and the material of the current-spreading layer 150 is, for instance, a transparent conductive material. For instance, the material of the current-blocking layer 160 includes a dielectric material such as SiOx, SiNx, the material of the current-spreading layer 150 includes a conductive material such as indium tin oxide (ITO), indium zinc oxide (IZO), and the invention is not limited thereto.

In the present embodiment, the quantum well layer 114 is, for instance, a multiple quantum well (MQW) formed by a plurality of well layers and barrier layers stacked in an alternating manner, and the invention is not limited thereto. In other embodiments, the quantum well layer 114 can also be a single quantum well (SQW) layer. Moreover, the wavelength range of the light emitted by the LED 100a is decided by the material of the quantum well layer 114, wherein the material forming the quantum well layer 114 is, for instance, a material such as GaN, InGaN, or AlInGaN, and the invention is not limited thereto.

Further referring to FIG. 1A. Specifically, the substrate 140 of the present embodiment further includes a semiconductor layer 142 and a base 144, wherein the doping concentration of the semiconductor layer 142 is within the range of $10^{15}$ cm$^{-3}$ to $5\times10^{17}$ cm$^{-3}$. More specifically, when the doping concentration of the semiconductor layer 142 is within $10^{15}$ cm$^{-3}$ to $5\times10^{16}$ cm$^{-3}$, the semiconductor layer 142 is an unintentionally-doped semiconductor layer; and when the doping concentration of the semiconductor layer 142 is within $10^{16}$ cm$^{-3}$ to $5\times10^{17}$ cm$^{-3}$, the semiconductor layer 142 is a semiconductor layer 142 having relatively low-doped concentration. Moreover, the doping concentration of the first-type doped semiconductor layer 112 is within the range of $10^{17}$ cm$^{-3}$ to $10^{19}$ cm$^{-3}$. In other words, the doping concentration of the first-type doped semiconductor layer 112 is high relative to the semiconductor layer 142 (highly-doped concentration). Moreover, the location of the semiconductor layer 142 is between the first-type doped semiconductor layer 112 and the base 144.

In the present embodiment, the material of the semiconductor layer 142 is, for instance, a high energy band semiconductor layer (such as AlGaN); and the material of the base 144 is an insulating material, wherein the insulating material is, for instance, sapphire.

Specifically, the first-type doped semiconductor layer 112 includes at least one opening 1122. The at least one opening 1122 is one opening 1122, and the opening 1122 is located in the direction from the second electrode 130 to the first electrode 120. The opening 1122 exposes a portion of the semiconductor layer 142, wherein the soldering portion 122 and a portion of the branch portion 124 of the first electrode 122 are disposed in the opening 1122 and disposed on the semiconductor layer 142. It should be mentioned that, the soldering portion 122 of the first electrode 122 is not in contact with a portion of the first-type doped semiconductor layer 112. In other words, a gap is between the soldering portion 122 of the first electrode 122 and the first-type doped semiconductor layer 112. As a result, electron flow (or current) can be prevented from moving directly from the soldering portion 122 of the first electrode 122 to the quantum well layer 114 via the first-type doped semiconductor layer 112.

Referring further to FIG. 1A, in the present embodiment, since the soldering portion 122 and the portion of the branch portion 124 of the first electrode 122 are disposed on the unintentionally-doped semiconductor layer 142 or the semiconductor layer 142 having low-doped concentration, another portion of the branch portion 124 of the first electrode 122 is disposed on the first-type doped semiconductor layer 122 having higher doping concentration. Therefore, non-Ohmic contact is formed at the interface of the soldering portion 122 of the first electrode 120 and the semiconductor layer 142 and the interface of the portion of the branch portion 124 and the semiconductor layer 142. It should be mentioned that, since the resistance of the interface at which non-Ohmic contact is formed is greater, current (or electron flow) less readily passes through the interface at which non-Ohmic contact is forming. Therefore, the interface having non-Ohmic contact has the function of current-blocking.

Next, further referring to FIG. 1A and FIG. 1B. From the perspective of electron flow, when an external power supply provides a driving voltage to the LED 100a, electron flow enters the LED 100a from the first electrode 120. Since the interface of the soldering portion 122 of the first electrode 120 and the semiconductor layer 142 and the interface of the portion of the branch portion 124 and the semiconductor layer 142 are non-Ohmic contact interfaces, most of the electron flow enters the farther branch portion 124 of the soldering portion 122 via the soldering portion 122 of the first electrode 120, for entering the corresponding region of the first-type doped semiconductor layer 112. In short, the region of the first-type doped semiconductor layer 112 receiving the electron flow at least includes the region at which the branch portion 124 and the first-type doped semiconductor layer 112 are in contact, and the electron flow enters the quantum well layer 114 via the first-type doped semiconductor layer 112. In other words, the electron flow can be uniformly distributed on the surface of the LED 100a via the path. Moreover, the electron holes provided by the second electrode 130 also move to the quantum well layer 114 from the second electrode 130, such that the light-emitting region of the LED 100a is more uniform. As a result, electrons and electron holes are recombined in the quantum well layer 114 to produce more photons, and the overall luminous efficiency is also increased.

Figure 1C:
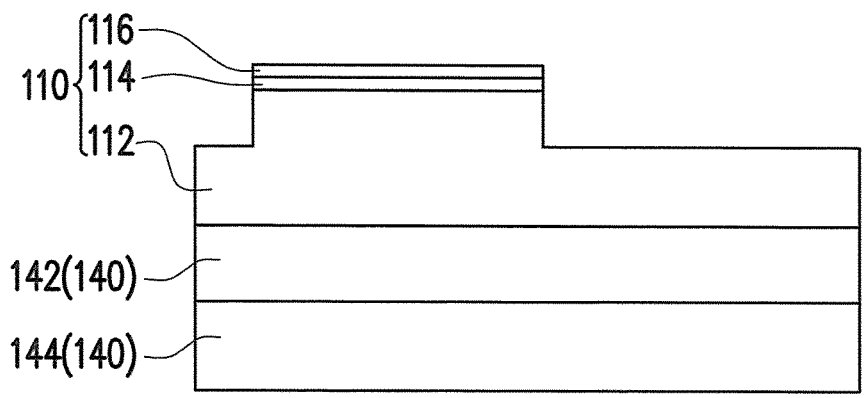
FIG. 1C to FIG. 1F are flow schematics of a manufacturing method of the LED according to the first embodiment of the invention.

FIG. 1C to FIG. 1F are flow schematics of a manufacturing method of an LED shown in FIG. 1A and FIG. 1B. Referring to FIG. 1C, in the present embodiment, the manufacturing method of the LED 100a shown in FIG. 1A and FIG. 1B includes growing a semiconductor epitaxial layer 110 on a substrate 140, wherein the semiconductor epitaxial layer 110 has a first-type doped semiconductor layer 112, a quantum well layer 114, and a second-type doped semiconductor layer 116. Specifically, the first-type doped semiconductor layer 112 is formed on the substrate 140, the quantum well layer 114 is formed on the first-type doped semiconductor layer 112, and the second-type doped semiconductor layer 116 is formed on the quantum well layer 114. The method of growing the semiconductor epitaxial layer 110 adopts, for instance, a metal-organic chemical vapor deposition (MOCVD) method. Next, a portion of the first-type doped semiconductor layer 112, a portion of the quantum well layer 114, and a portion of the second-type doped semiconductor layer 116 are removed via etching and a portion of the first-type doped semiconductor layer 112 is exposed. The specific etching method is as follows: a photoresist layer is first coated on the second-type doped semiconductor layer 116, and then the region not covered by the photoresist layer is etched by using a photolithography process, wherein the etching method can be inductively-coupled plasma (ICP). Moreover, in the present embodiment, the substrate 140 includes a semiconductor layer 142 and a base 144, wherein the semiconductor layer 142 is formed on the base 144.

Figure 1D:
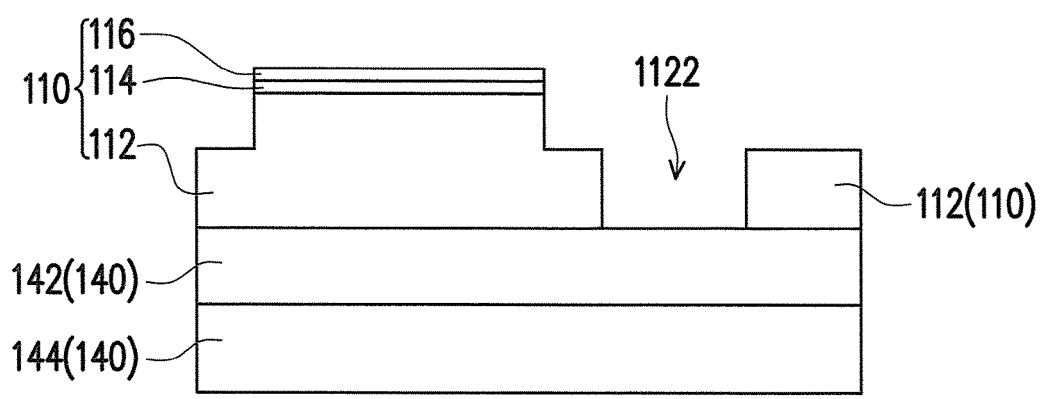

Next, referring to FIG. 1C and FIG. 1D, specifically, the first-type doped semiconductor layer 112, the quantum well layer 114, and the second-type doped semiconductor layer 116 are, for instance, formed by epitaxy. Moreover, a portion of the first-type doped semiconductor layer 112 is removed via etching and an opening 1122 is formed. The opening 1122 exposes a portion of the semiconductor layer 142.

Figure 1E:
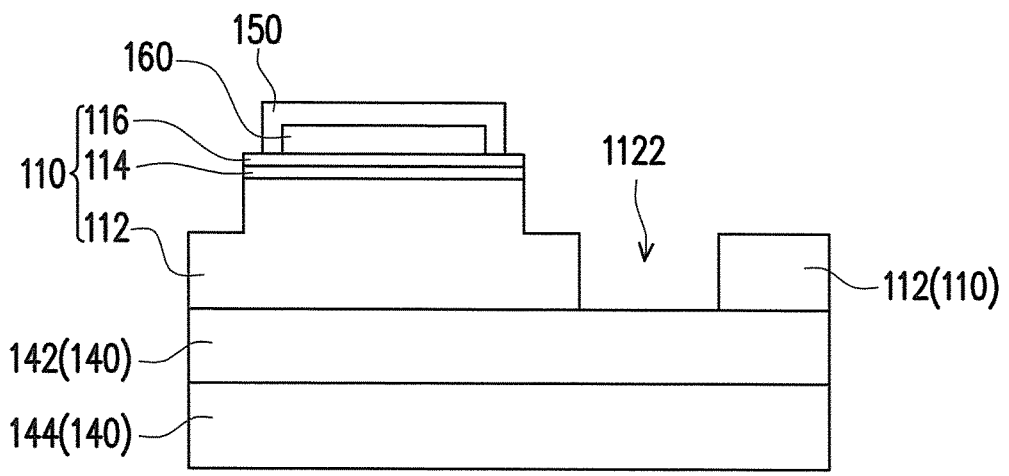

Next, referring to FIG. 1E, in the present embodiment, the manufacturing method of the LED 100a includes forming a current-blocking layer 160 on the second-type doped semiconductor layer 116 and forming a current-spreading layer 150 on the second-type doped semiconductor layer 116, and covering the current-blocking layer 160 with the current-spreading layer 150, wherein the current-blocking layer 130 includes a main body 132 and an extending portion 134 extended from the main body 132. The method of forming the current-blocking layer 160 and the current-spreading layer 150 is, for instance, a sputtering method. In particular, after the current-blocking layer 160 is formed on the second-type doped semiconductor layer 116, a high-temperature process can be further included to improve the characteristics of adhesion and etch resistance of the current-blocking layer 160. The temperature of the high-temperature process can be higher than the growth deposition operating temperature of the current-blocking layer 160, and a preferred high-temperature process temperature is between 150 degrees and 600 degrees.

Figure 1F:
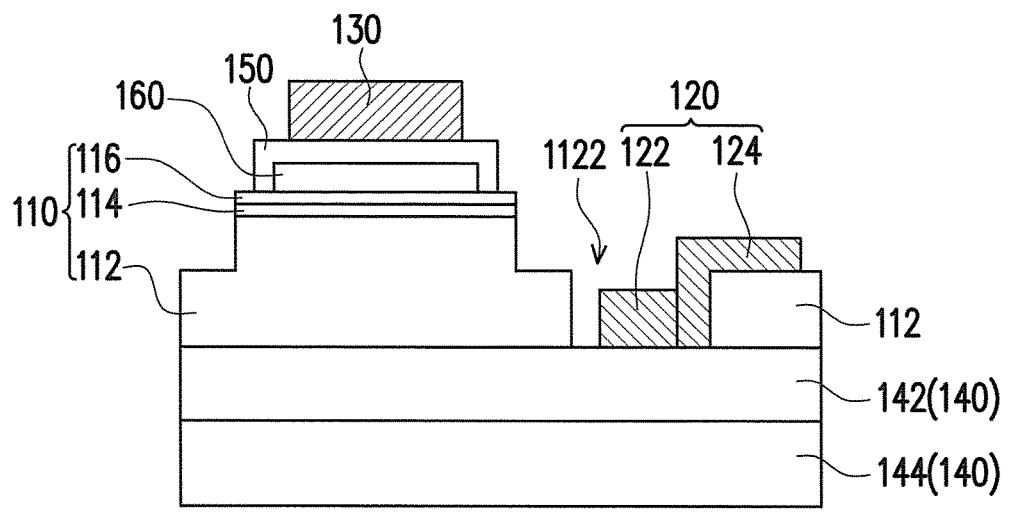

Next, referring to FIG. 1F, in the present embodiment, the manufacturing method of the LED 100a includes forming a first electrode 120 in the opening 1122, and forming a second electrode 130 on the current-spreading layer 150 and electrically connecting the second electrode 130 to the second-type doped semiconductor layer 116, wherein the first electrode 120 includes a soldering portion 122 and a branch portion 124 extended from the soldering portion 122, and the first electrode 120 and the second electrode 130 are respectively electrically connected to the first-type doped semiconductor layer 112 and the current-spreading layer 150. In the present embodiment, the soldering portion 122 and a portion of the branch portion 124 are disposed in the opening 1122 and disposed on the semiconductor layer 142. In the present embodiment, the method of forming (deposition) the first electrode 120 and the second electrode 130 can be plasma-enhanced chemical vapor deposition (PECVD), electron beam (e-beam), sputtering method, vacuum evaporation, or electroplating. At this point, the LED 100a is largely complete.

Second Embodiment

Figure 2A:
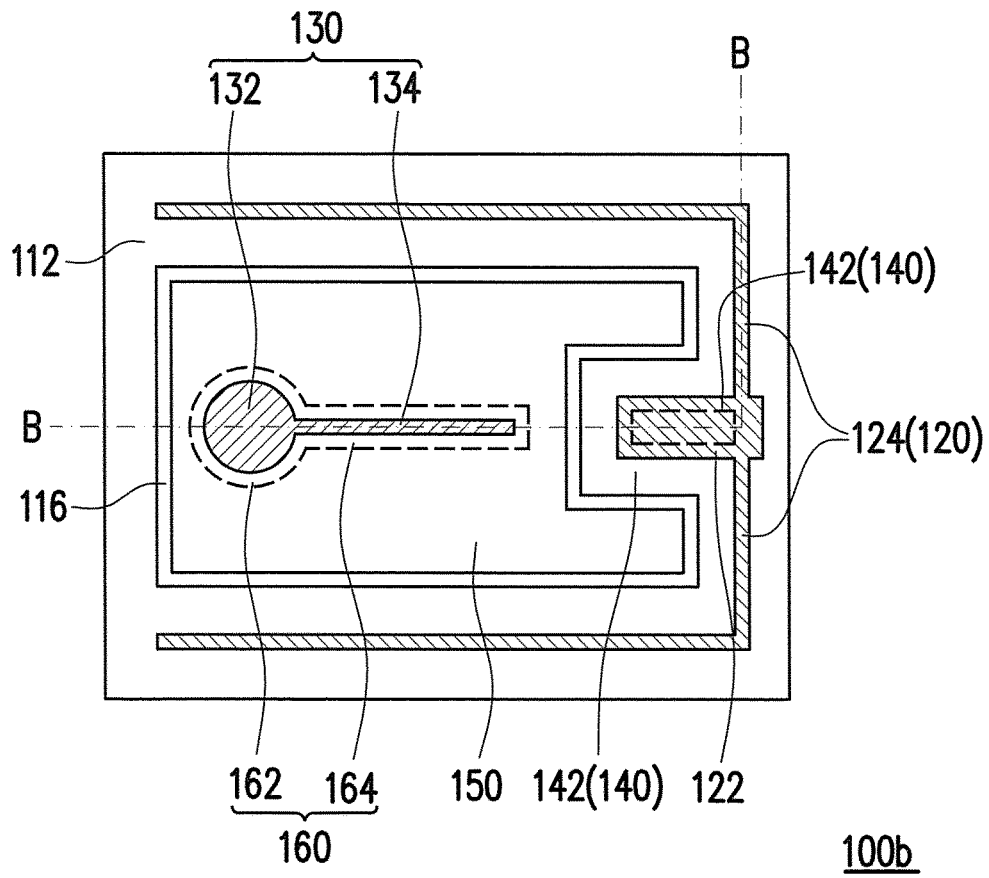
FIG. 2A and FIG. 2B respectively show a top schematic view and a cross-sectional schematic view of the LED of the second embodiment of the invention.
Figure 2B:
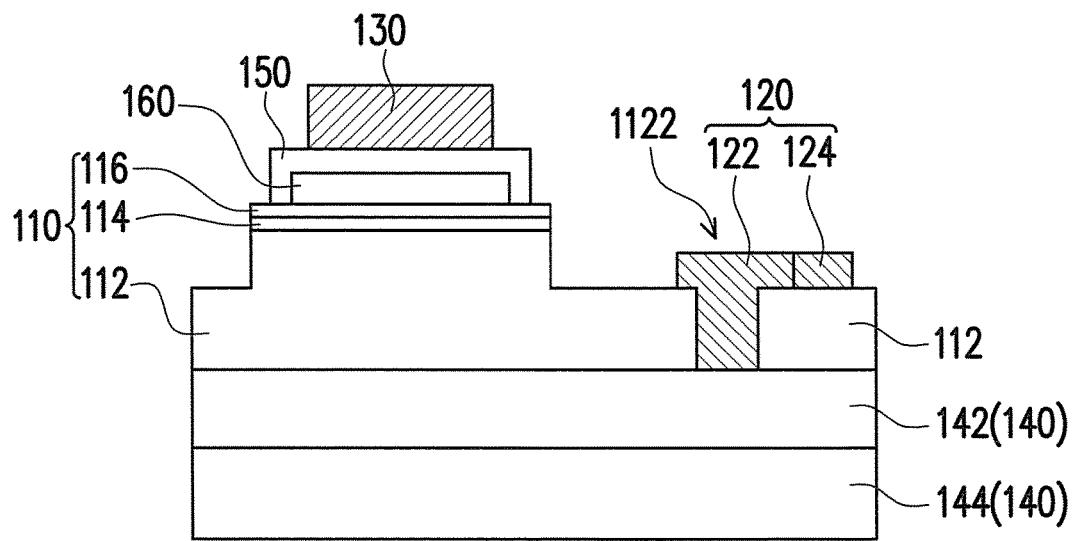

FIG. 2A is a top schematic view of the LED according to the second embodiment of the invention, and FIG. 2B is a cross-sectional schematic view of the LED of the second embodiment of the invention along line B-B. In the present embodiment, an LED 100b shown in FIG. 2A and FIG. 2B is similar to the LED 100a shown in FIG. 1A and FIG. 1B, and the components having the same reference numerals in the LED 100a and the LED 100b and relevant descriptions thereof are as provided for the LED 100a of the first embodiment and are not repeated herein. In the present embodiment, the main difference between the LED 100b and the LED 100a is: the branch portion 124 is disposed on the first-type doped semiconductor layer 112, the soldering portion 122 of the first electrode 120 completely fills the opening 1122, and a portion of the soldering portion 122 of the first electrode 120 is disposed on the first-type doped semiconductor layer 112. The manufacturing method of the LED 100b is substantially similar to the manufacturing method of the LED 100a, and the main difference thereof is: the branch portion 124 is controlled to be formed on the first-type doped semiconductor layer 112 by the means of modifying the photomask in the process of FIG. 1F, and the invention is not limited thereto.

Third Embodiment

Figure 3A:
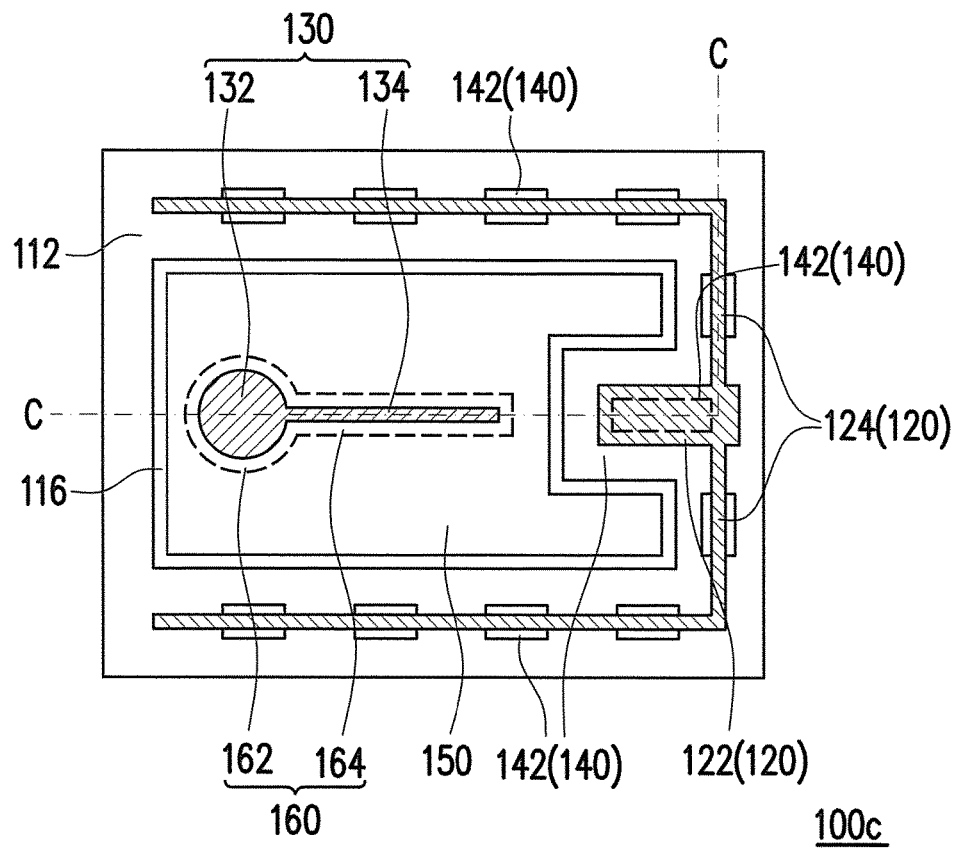
FIG. 3A and FIG. 3B respectively show a top schematic view and a cross-sectional schematic view of the LED of the third embodiment of the invention.
Figure 3B:
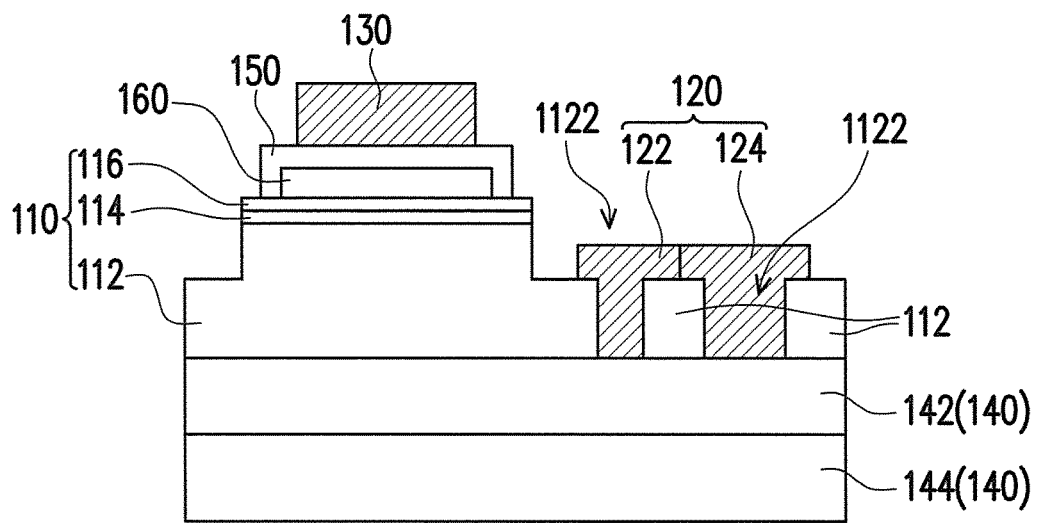

FIG. 3A is a top schematic view of the LED according to the third embodiment of the invention, and FIG. 3B is a cross-sectional schematic view of the LED of the third embodiment of the invention along line C-C. In the present embodiment, an LED 100c shown in FIG. 3A and FIG. 3B is similar to the LED 100b shown in FIG. 2A and FIG. 2B, and the components having the same reference numerals in the LED 100c and the LED 100b and relevant descriptions thereof are as provided for the LED 100b of the second embodiment and are not repeated herein. In the present embodiment, the main difference between the LED 100c and the LED 100b is: the at least one opening 1122 is a plurality of openings 1122, and one of the openings 1122 is located in the direction from the second electrode 130 to the first electrode 120, and the other openings 1122 are arranged along the extending direction of the branch portion 124. The branch portion 124 is disposed in the other openings 1122 arranged along the extending direction of the branch portion 124 and disposed on the semiconductor layer 142, wherein non-Ohmic contact is formed at the interface of the branch portion 124 and the semiconductor layer 142. The manufacturing method of the LED 100c is substantially similar to the manufacturing method of the LED 100b, and the main difference thereof is: a plurality of openings 1122 is controlled to be formed on the first-type doped semiconductor layer 112 by changing the means of etching in the process of FIG. 1E, wherein the locations at which the openings 1122 are formed are as described above, and the invention is not limited thereto.

Fourth Embodiment

Figure 4A:
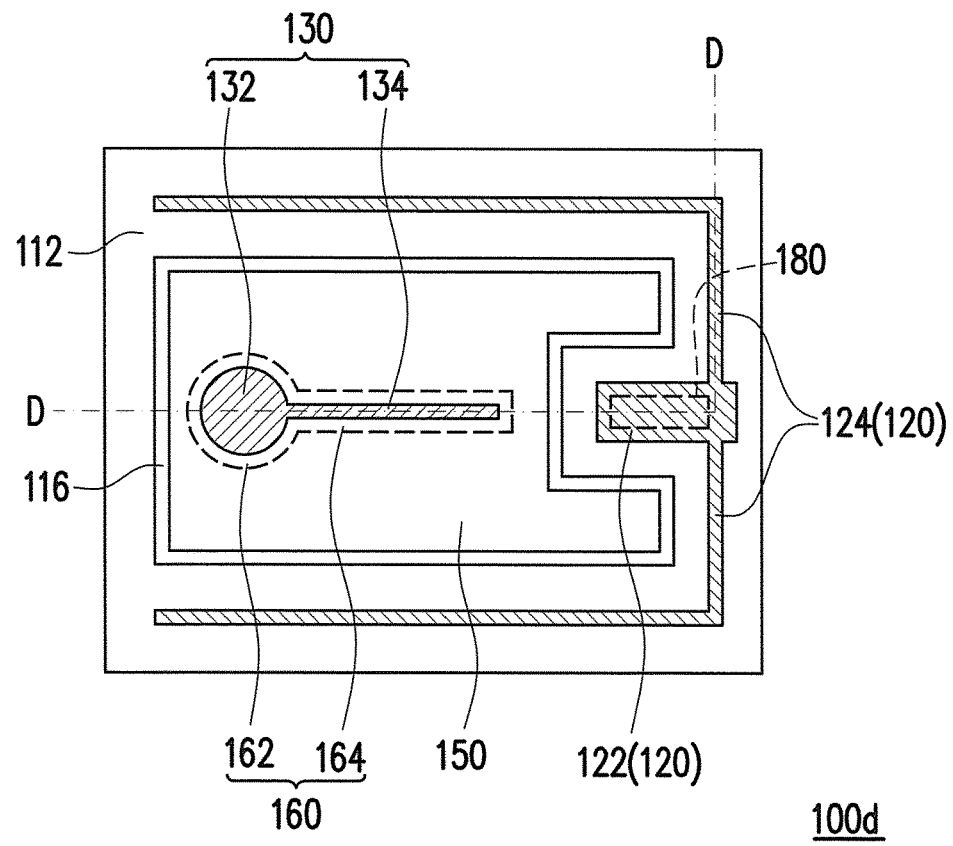
FIG. 4A and FIG. 4B respectively show a top schematic view and a cross-sectional schematic view of the LED of the fourth embodiment of the invention.
Figure 4B:
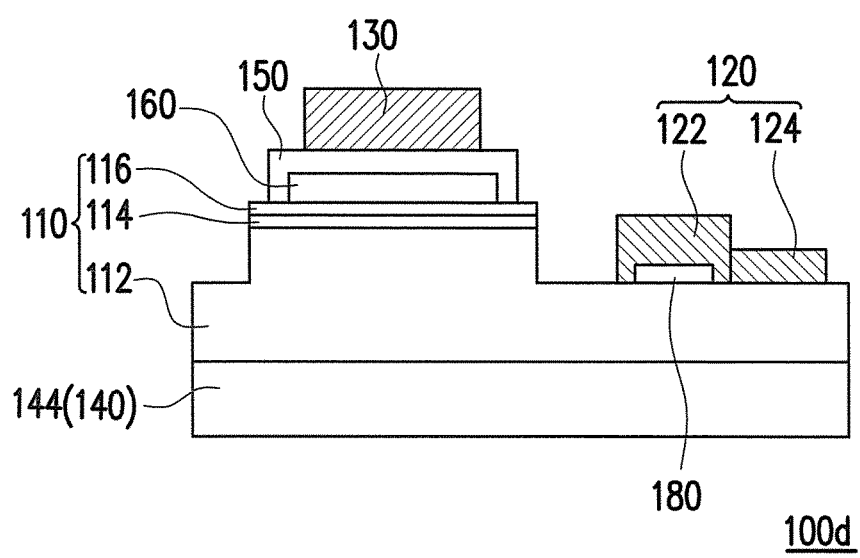

FIG. 4A is a top schematic view of the LED according to the fourth embodiment of the invention, and FIG. 4B is a cross-sectional schematic view of the LED of the fourth embodiment of the invention along line D-D. In the present embodiment, an LED 100d shown in FIG. 4A and FIG. 4B is similar to the LED 100a shown in FIG. 1A and FIG. 1B, and the components having the same reference numerals in the LED 100d and the LED 100a and relevant descriptions thereof are as provided for the LED 100a of the first embodiment and are not repeated herein. In the present embodiment, the main difference between the LED 100d and the LED 100a is: the quantum well layer 114 is disposed on the first-type doped semiconductor layer 112 to expose a portion of the first-type doped semiconductor layer 112, and the soldering portion 122 and the branch portion 124 are disposed on the portion of the first-type doped semiconductor layer 112 exposed by the quantum well layer 114. Next, in the present embodiment, the substrate 140 includes a base 144. Moreover, in the present embodiment, the LED 100d further includes at least one current-blocking layer 180 (one is exemplified in the present embodiment), and the current-blocking layer 180 is disposed between the soldering portion 122 and the first-type doped semiconductor layer 112, wherein non-Ohmic contact is formed between the soldering portion 122 and the first-type doped semiconductor layer 112. Specifically, non-Ohmic contact is formed at the interface of the soldering portion 122 and the current-blocking layer 180. Moreover, in the present embodiment, the soldering portion 122 covers the current-blocking layer 180, and a small portion of the soldering portion 122 is also in contact with the first-type doped semiconductor layer 112.

It should be mentioned that, in the present embodiment, although a small portion of the soldering portion 122 is in contact with the first-type doped semiconductor layer 112, the corresponding contact area thereof is smaller, and most of the electron flow remains to enter the farther branch portion 124 of the soldering portion 122 from the soldering portion 122 for entering the corresponding region of the first-type doped semiconductor layer 112.

It should be mentioned that, in the present embodiment, the material of the first electrode 120 contains, for instance, a single-layer or multilayer material containing Cr such that Ohmic contact is formed between the first electrode 120 and the first-type doped semiconductor layer 112, wherein the multilayer material can further contain Ti, Ni, Pt, Au, or Al. The material of the corresponding current-blocking layer 180 is, for instance, Ni, Al, Pt, Au, or a combination of non-Ohmic contact materials thereof. Therefore, based on the material characteristics of the current-blocking layer 180, non-Ohmic contact is formed between the current-blocking layer 180 and the first-type doped semiconductor layer 112.

Figure 4C:
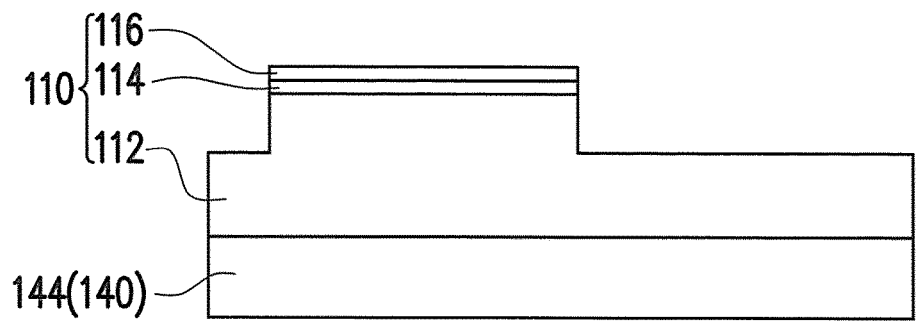
FIG. 4C to FIG. 4F are flow schematics of the manufacturing method of the LED according to the fourth embodiment of the invention.

FIG. 4C to FIG. 4F are flow schematics of a manufacturing method of the LED shown in FIG. 4A and FIG. 4B. Referring first to FIG. 4C, in the present embodiment, the manufacturing method of the LED 100d shown in FIG. 4A and FIG. 4B includes growing a semiconductor epitaxial layer 110 on a substrate 140, wherein the semiconductor epitaxial layer 110 has a first-type doped semiconductor layer 112, a quantum well layer 114, and a second-type doped semiconductor layer 116. Specifically, the first-type doped semiconductor layer 112 is formed on the substrate 140, the quantum well layer 114 is formed on the first-type doped semiconductor layer 112, and the second-type doped semiconductor layer 116 is formed on the quantum well layer 114. For instance, the method of forming the semiconductor epitaxial layer 110 adopts, for instance, a metalorganic chemical vapor deposition (MOCVD) method. More specifically, a portion of the first-type doped semiconductor layer 112, a portion of the quantum well layer 114, and a portion of the second-type doped semiconductor layer 116 are removed via etching to expose a portion of the first-type doped semiconductor layer 112. The specific etching method is as follows: a photoresist layer is first coated on the second-type doped semiconductor layer 116, and then the region not covered by the photoresist layer is etched, wherein the etching method can be inductively-coupled plasma (ICP). Moreover, in the present embodiment, the substrate 140 includes a base 144, wherein the first-type doped semiconductor layer 112 is formed on the base 144.

Figure 4D:
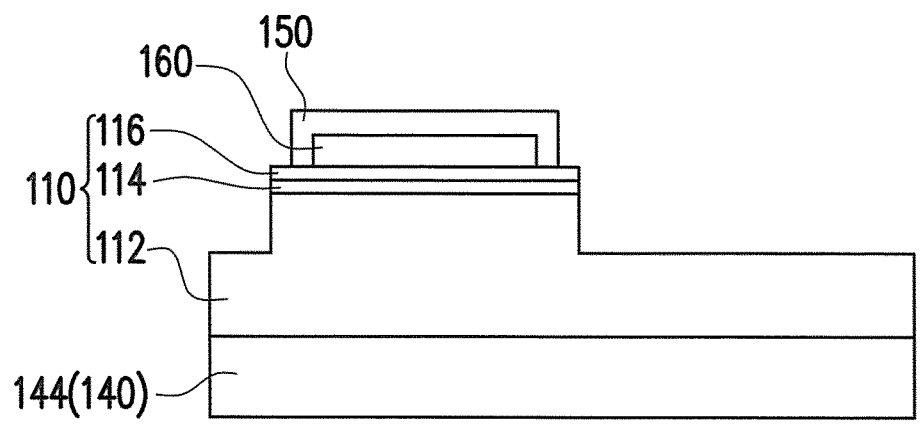

Next, referring to FIG. 4C and FIG. 4D, specifically, in the present embodiment, the manufacturing method of the LED 100d includes forming a current-blocking layer 160 on the second-type doped semiconductor layer 116 and forming a current-spreading layer 150 on the second-type doped semiconductor layer 116, and covering the current-blocking layer 160 with the current-spreading layer 150, wherein the current-blocking layer 130 includes a main body 132 and an extending portion 134 extended from the main body 132.

Figure 4E:
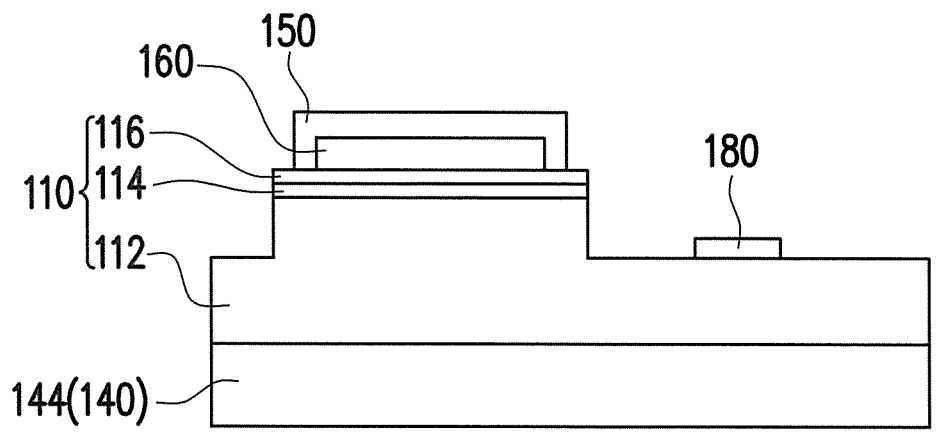

Then, referring to FIG. 4E, in the present embodiment, the manufacturing method of the LED 100d includes forming a current-blocking layer 180 on the first-type doped semiconductor layer 112. The method of forming the current-blocking layer 180 is, for instance, a sputtering method.

Figure 4F:
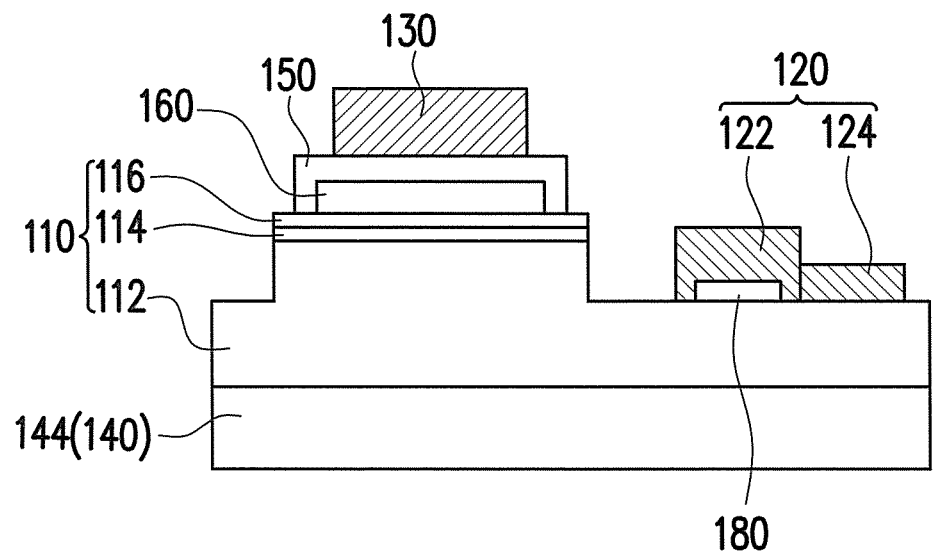

Next, referring to FIG. 4F, in the present embodiment, the manufacturing method of the LED 100d includes forming a first electrode 120 on the first-type doped semiconductor layer 112, wherein the first electrode 120 includes a soldering portion 122 and a branch portion 124 extended from the soldering portion 122, and the second electrode 130 includes a soldering portion 132 and a finger portion 134 extended from the soldering portion 132, and the first electrode 120 and the second electrode 130 are respectively electrically connected to the first-type doped semiconductor layer 112 and the current-spreading layer 150. In the present embodiment, the method of forming (deposition) the first electrode 120 and the second electrode 130 can be plasma-enhanced chemical vapor deposition (PECVD), electron beam (e-beam), sputtering method, vacuum evaporation, or electroplating. At this point, the LED 100d is largely complete.

Fifth Embodiment

Figure 5A:
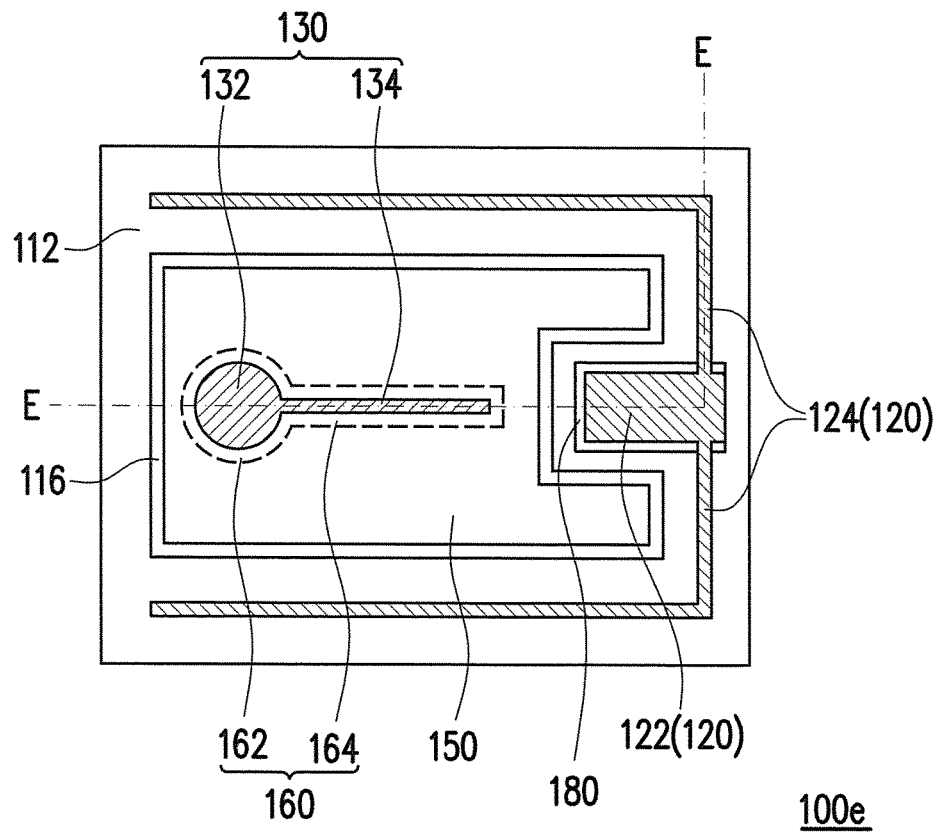
FIG. 5A and FIG. 5B respectively show a top schematic view and a cross-sectional schematic view of the LED of the fifth embodiment of the invention.
Figure 5B:
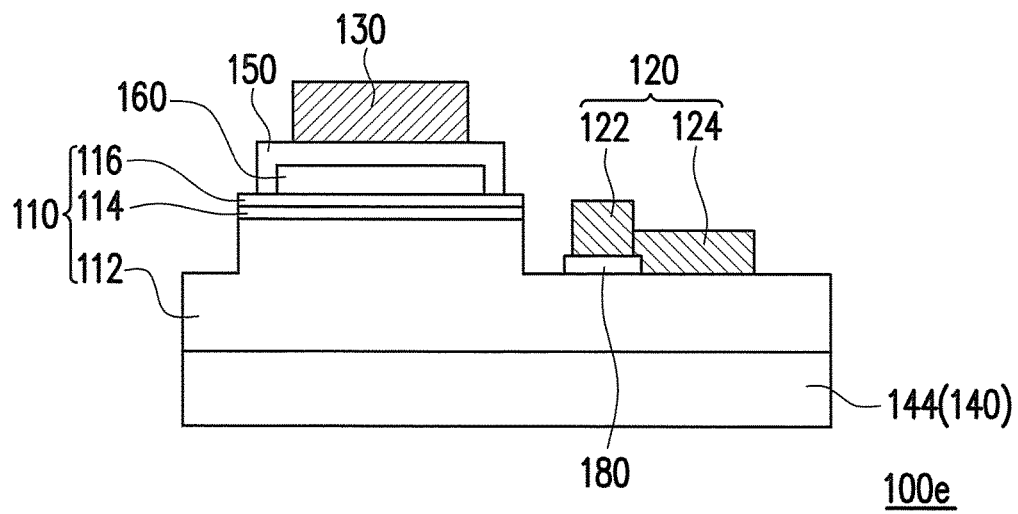

FIG. 5A is a top schematic view of the LED according to the fifth embodiment of the invention, and FIG. 5B is a cross-sectional schematic view of the LED of the fifth embodiment of the invention along line E-E. In the present embodiment, an LED 100e shown in FIG. 5A and FIG. 5B is similar to the LED 100d shown in FIG. 4A and FIG. 4B, and the components having the same reference numerals in the LED 100e and the LED 100d and relevant descriptions thereof are as provided for the LED 100a of the first embodiment and the LED 100d of the fourth embodiment and are not repeated herein. In the present embodiment, the main difference between the LED 100e and the LED 100d is: the soldering portion 122 exposes a portion of the current-blocking layer 180. The manufacturing method of the LED 100e is substantially similar to the manufacturing method of the LED 100d, and the main difference thereof is: the soldering portion 122 is controlled to expose a portion of the current-blocking layer 180 by the means of modifying the photomask in the process of FIG. 4F, and the invention is not limited thereto.

Sixth Embodiment

Figure 6A:
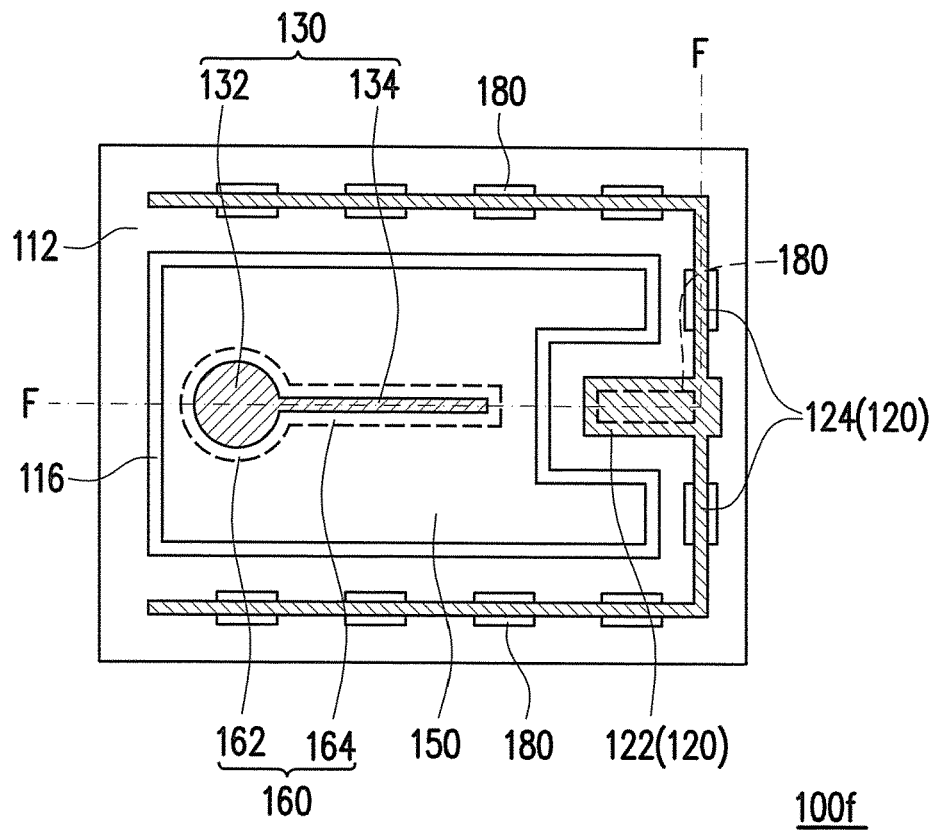
FIG. 6A and FIG. 6B respectively show a top schematic view and a cross-sectional schematic view of the LED of the sixth embodiment of the invention.
Figure 6B:
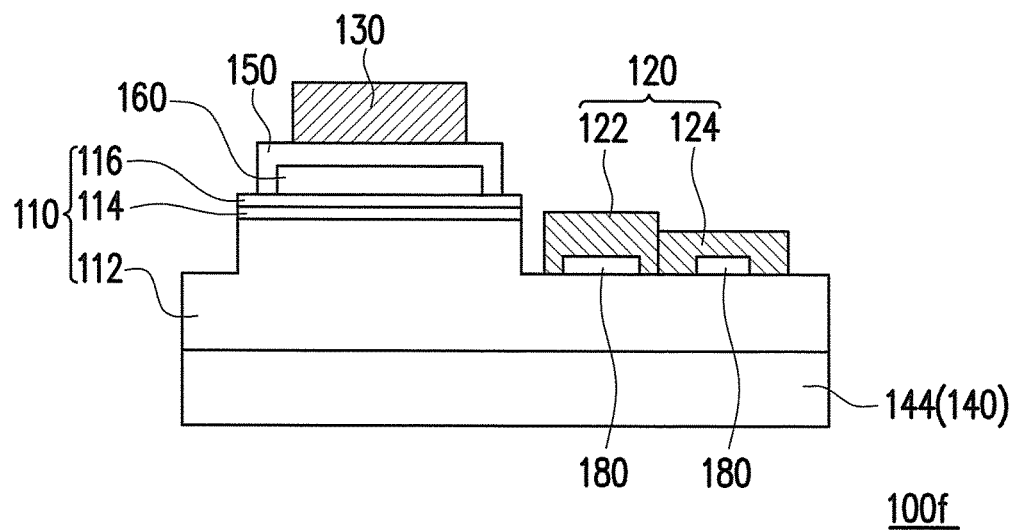

FIG. 6A is a top schematic view of the LED according to the fifth embodiment of the invention, and FIG. 6B is a cross-sectional schematic view of the LED of the sixth embodiment of the invention along line F-F. In the present embodiment, an LED 100f shown in FIG. 6A and FIG. 6B is similar to the LED 100d shown in FIG. 4A and FIG. 4B, and the components having the same reference numerals in the LED 100f and the LED 100d and relevant descriptions thereof are as provided for the LED 100a of the first embodiment and the LED 100d of the fourth embodiment and are not repeated herein. In the present embodiment, the main difference between the LED 100f and the LED 100d is: the at least one current-blocking layer 180 is a plurality of current-blocking layers 180, one of the current-blocking layers 180 is disposed between the soldering portion 122 and the first-type doped semiconductor layer 122, the other current-blocking layers 180 are arranged along the extending direction of the branch portion 124, and the branch portion 124 is disposed on each of the current-blocking layers 180, wherein non-Ohmic contact is formed at the interface of the branch portion 124 and each of the current-blocking layers 180. The manufacturing method of the LED 100f is substantially similar to the manufacturing method of the LED 100d, and the main difference thereof is: a plurality of current-blocking layers 180 is formed on the first-type doped semiconductor layer 112 by the means of modifying the photomask in the process of FIG. 4E, and the invention is not limited thereto.

Seventh Embodiment

Figure 7A:
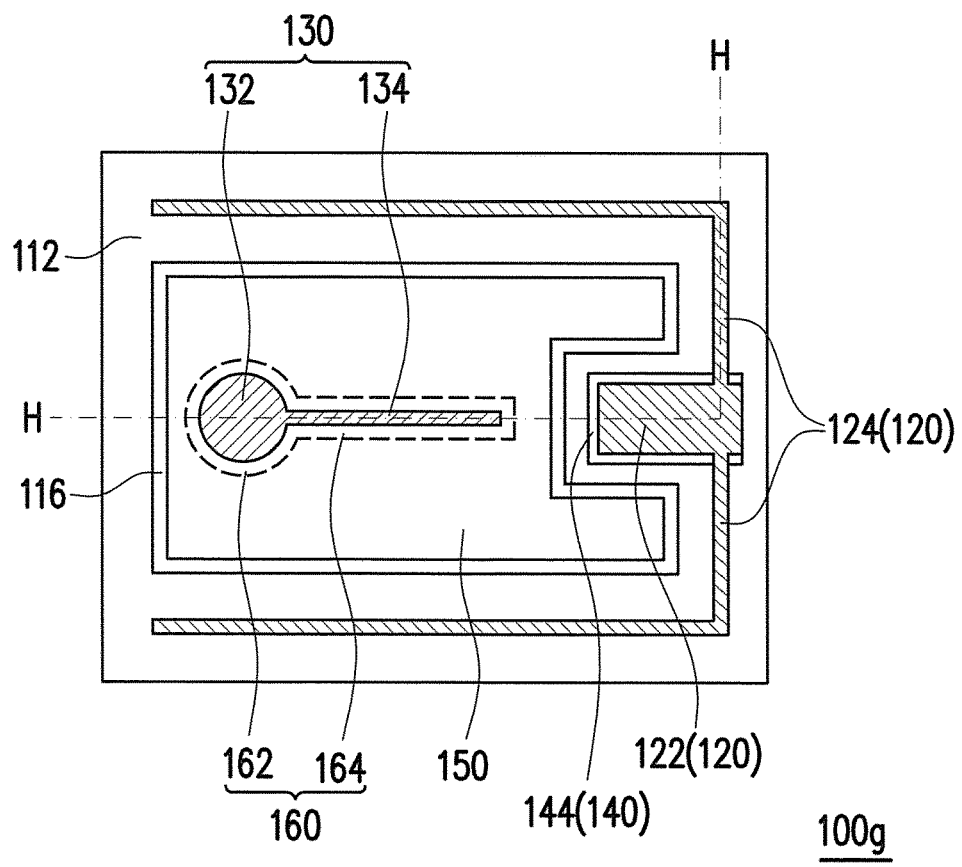
FIG. 7A and FIG. 7B respectively show a top schematic view and a cross-sectional schematic view of the LED of the seventh embodiment of the invention.
Figure 7B:
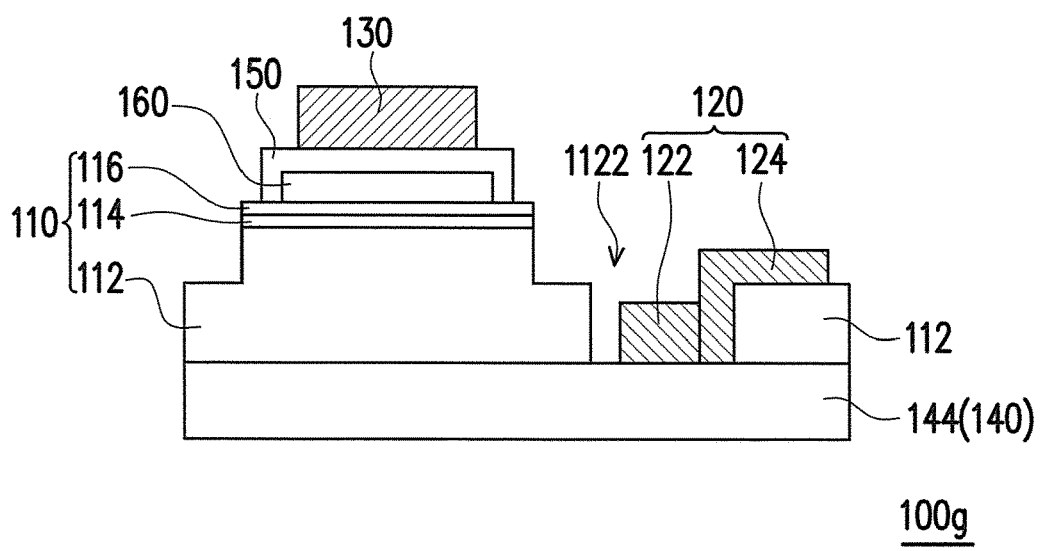

FIG. 7A is a top schematic view of the LED according to the seventh embodiment of the invention, and FIG. 7B is a cross-sectional schematic view of the LED of the seventh embodiment of the invention along line H-H. In the present embodiment, an LED 100g shown in FIG. 7A and FIG. 7B is similar to the LED 100a shown in FIG. 1A and FIG. 1B, and the components having the same reference numerals in the LED 100g and the LED 100a and relevant descriptions thereof are as provided for the LED 100a of the first embodiment and are not repeated herein. In the present embodiment, the main difference between the LED 100g and the LED 100a is: in the present embodiment, the substrate 140 includes a base 144, wherein the soldering portion 124 and a portion of the branch portion 124 of the first electrode 120 are disposed on the base 144, and non-Ohmic contact is formed at the interface of the soldering portion 122 and the base 144 and the interface of the portion of the branch portion 124 and the base 144. Moreover, in the present embodiment, the first-type doped semiconductor layer 112 includes an opening 1122, the opening 1122 exposes a portion of the base 144, and the opening 1122 is located in the direction from the second electrode 130 to the first electrode 120, wherein the soldering portion 122 and the portion of the branch portion 124 are disposed in the opening 1122.

Eighth Embodiment

Figure 8A:
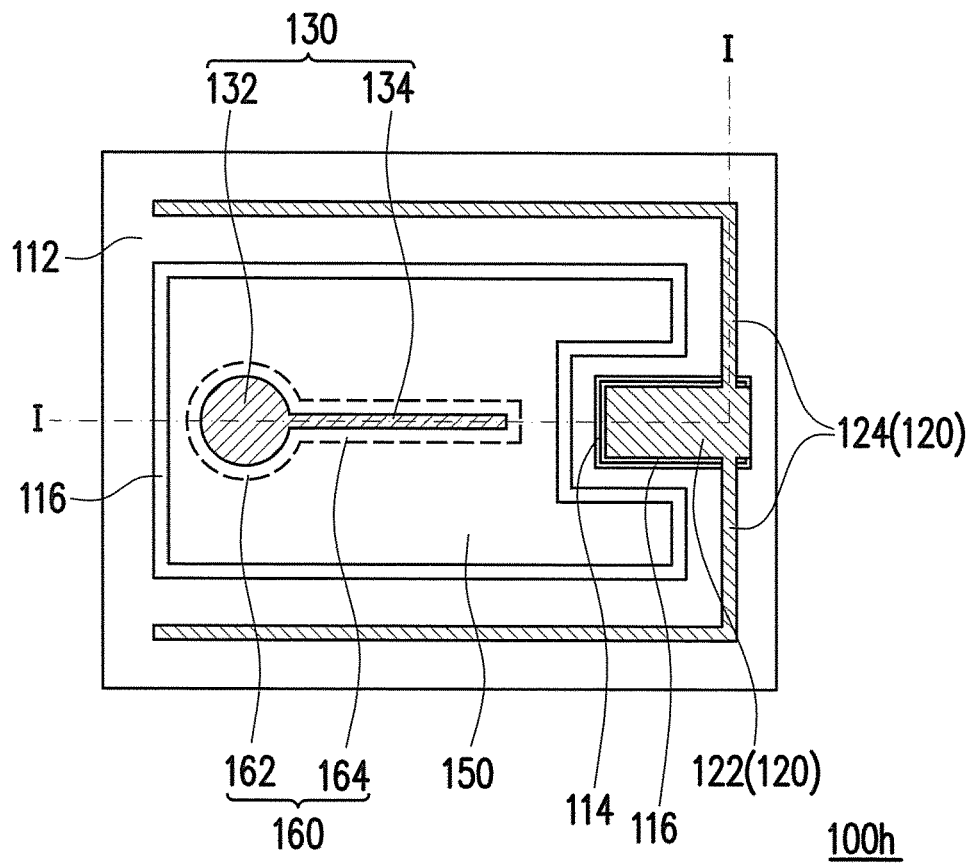
FIG. 8A and FIG. 8B respectively show a top schematic view and a cross-sectional schematic view of the LED of the eighth embodiment of the invention.
Figure 8B:
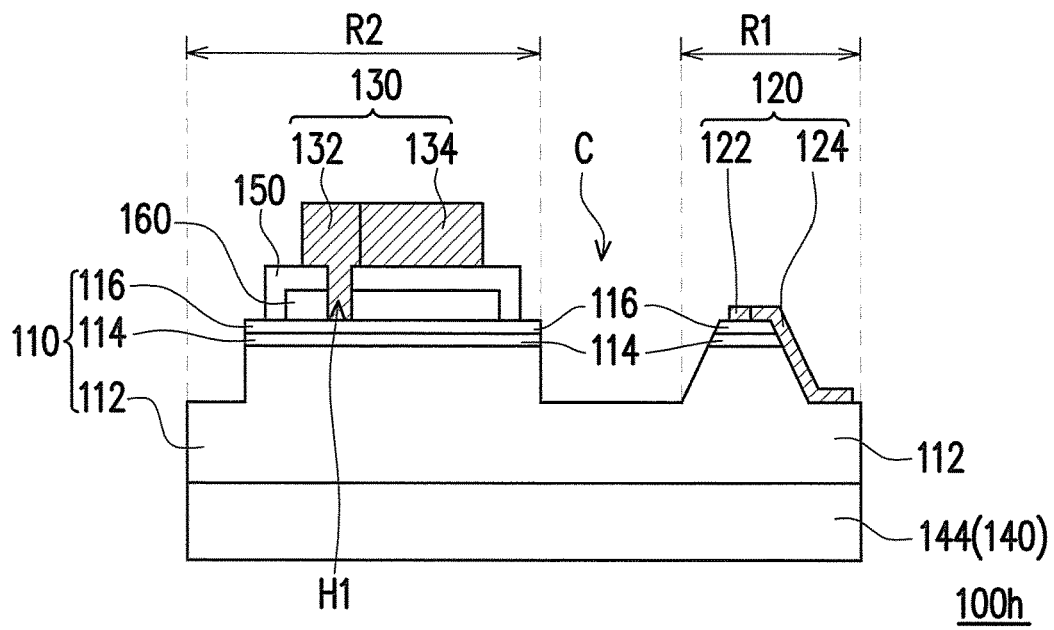

FIG. 8A is a top schematic view of the LED according to the eighth embodiment of the invention, and FIG. 8B is a cross-sectional schematic view of the LED of the eighth embodiment of the invention along line I-I. In the present embodiment, an LED 100h shown in FIG. 8A and FIG. 8B is similar to the LED 100a shown in FIG. 1A and FIG. 1B, and the components having the same reference numerals in the LED 100h and the LED 100a and relevant descriptions thereof are as provided for the LED 100a of the first embodiment and are not repeated herein. In the present embodiment, the main difference between the LED 100h and the LED 100a is: in the present embodiment, the substrate 140 includes a base 144 and does not include a semiconductor layer 142. A recessed portion C is formed in the semiconductor epitaxial layer 110 in the LED 100g. The recessed portion C separates the second-type doped semiconductor layer 116, the quantum well layer 114, and a portion of the first-type doped semiconductor layer 112, the first-type doped semiconductor layer 112 is exposed at the bottom of the recessed portion C, and the recessed portion C defines a first region R1 and a second region R2 on the semiconductor epitaxial layer 110. The first region R1 and the second region R2 respectively contain a portion of the first-type doped semiconductor layer 112, a portion of the quantum well layer 114, and a portion of the second-type doped semiconductor layer 116 and are connected to each other via the first-type doped semiconductor layer 112. The first electrode 120 is located in the first region R1 and is located on at least a portion of the first-type doped semiconductor layer 112 and at least a portion of the second-type doped semiconductor layer 116, and is electrically connected to the portion of the first-type doped semiconductor layer 112 and the portion of the second-type doped semiconductor layer 116. The second electrode 130 is located on the second-type doped semiconductor layer 116 in the second region R2 and electrically connected to the second-type doped semiconductor layer 116. The quantum well layer 114 in the first region R1 does not emit light. The quantum well layer 114 in the second region R2 is configured to emit light. The first electrode 120 is located in the first region R1. The second electrode 130 is located in the second region R2. In the first region R1, the soldering portion 122 of the first electrode 120 is located on the second-type doped semiconductor layer 116. The branch portion 124 of the first electrode 120 is disposed on a portion of the first-type doped semiconductor layer 112. Non-Ohmic contact is formed between the soldering portion 122 in the first region R1 and the second-type doped semiconductor layer 116.

Referring further to FIG. 8B, specifically, in the present embodiment, in the first region R1, the area of the soldering portion 122 of the first electrode 120 is less than the area of the second-type doped semiconductor layer 116. Moreover, the branch portion 124 of the first electrode 120 covers a portion of the upper surface of the second-type doped semiconductor layer 116, a side surface of the second-type doped semiconductor layer 116, a side surface of the quantum well layer 114, and a portion of the upper surface of the portion of the first-type doped semiconductor layer 112. Moreover, in the first region R1, the shape of the cross-section of the first-type doped semiconductor layer 112, the quantum well layer 114, and the second-type doped semiconductor layer 116 is a trapezoid. Moreover, the current-blocking layer 160 and the current-spreading layer 150 are both located in the second region R2. The current-blocking layer 160 is disposed on the second-type doped semiconductor layer 116. The current-spreading layer 150 is disposed on the current-blocking layer 160 to cover the current-blocking layer 160. The second electrode 130 is electrically connected to the second-type doped semiconductor layer 116 via the current-spreading layer 150. The current-blocking layer 160 and the current-spreading layer 150 further contain a first opening H1. The first opening H1 exposes a portion of the second-type doped semiconductor layer 116. The second electrode 130 is disposed in the first opening H1. More specifically, the soldering portion 132 of the second electrode 130 is disposed in the first opening H1, and the second electrode 130 is extended outward from the first opening H1 onto the current-spreading layer 150.

Referring to FIG. 8A and FIG. 8B, from the perspective of electron flow, in the first region R1, two possible paths exist if electron flow enters the first-type doped semiconductor layer 112 from the soldering portion 122 of the first electrode 120. The first path consists of the soldering portion 122 of the first electrode 120, the second-type doped semiconductor layer 116, the quantum well layer 114, and the first-type doped semiconductor layer 112. The second path consists of the soldering portion 122 of the first electrode 120, the branch portion 124 of the first electrode 120, and the first-type doped semiconductor layer 116. Since the first path consists of more semiconductor layers, most of the electron flow moves to the first-type doped semiconductor layer 112 of the corresponding location along the second path. The resistance of the interface of the soldering portion 122 and the second-type doped semiconductor layer 116 is greater than the resistance of the interface of the branch portion 124 and the first-type doped semiconductor layer 112. In other words, non-Ohmic contact is formed between the soldering portion 122 in the first region R1 and the second-type doped semiconductor layer 116. In short, the region of the first-type doped semiconductor layer 112 receiving the electron flow at least includes the region at which the branch portion 124 and the first-type doped semiconductor layer 112 are in contact, and the electron flow enters the quantum well layer 114 in the second region R2 via the first-type doped semiconductor layer 112. As a result, the electron flow can be uniformly distributed on the surface of the LED 100h via the path. Moreover, the electron holes provided by the second electrode 130 also move to the quantum well layer 114 in the second region R2 from the second electrode 130, such that the light-emitting region of the LED 100h is more uniform. As a result, electrons and electron holes are recombined in the quantum well layer 114 in the second region R2 to produce more photons, and the overall luminous efficiency is also increased.

Figure 8C:
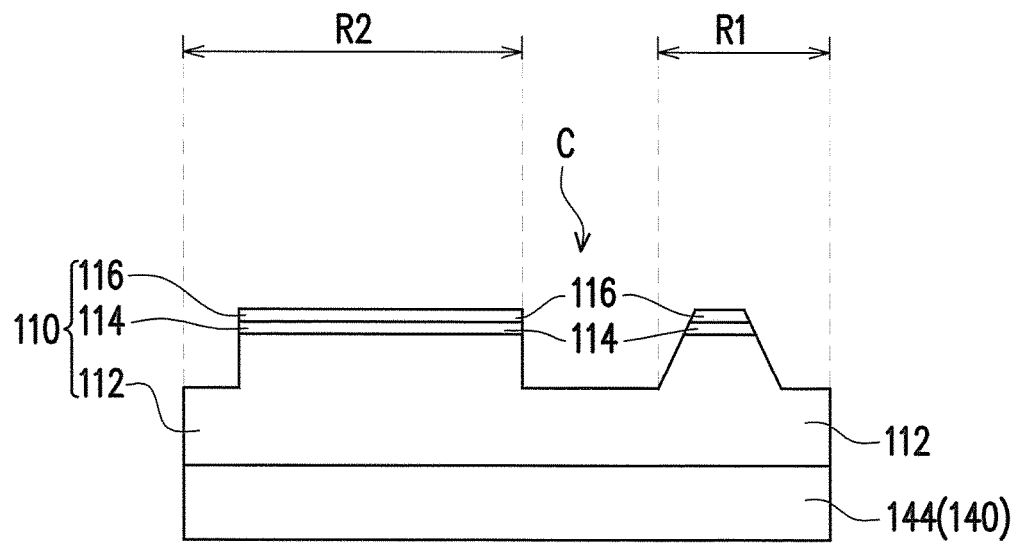
FIG. 8C to FIG. 8E are flow schematics of a manufacturing method of the LED according to the eighth embodiment of the invention.

FIG. 8C to FIG. 8F are flow schematics of a manufacturing method of the LED shown in FIG. 8A and FIG. 8B. Referring first to FIG. 8C, in the present embodiment, the manufacturing method of the LED 100h shown in FIG. 8A and FIG. 8B includes growing a semiconductor epitaxial layer 110 on a substrate 140, wherein the semiconductor epitaxial layer 110 has a first-type doped semiconductor layer 112, a quantum well layer 114, and a second-type doped semiconductor layer 116. Specifically, the first-type doped semiconductor layer 112 is formed on the substrate 140, the quantum well layer 114 is formed on the first-type doped semiconductor layer 112, and the second-type doped semiconductor layer 116 is formed on the quantum well layer 114. The method of growing the semiconductor epitaxial layer 110 adopts, for instance, a metal-organic chemical vapor deposition (MOCVD) method. Next, a portion of the first-type doped semiconductor layer 112, a portion of the quantum well layer 114, and a portion of the second-type doped semiconductor layer 116 are removed via etching and a portion of the first-type doped semiconductor layer 112 is exposed. Moreover, a recessed portion C is formed by etching to define a first region R1 and a second region R2. In the second region R2, the first-type doped semiconductor layer 112, the quantum well layer 114, and the second-type doped semiconductor layer 116 form the main light-emitting region. In the first region R1, the shape of the cross-section of the first-type doped semiconductor layer 112, the quantum well layer 114, and the second-type doped semiconductor layer 116 is, for instance, a trapezoid. The specific etching method is as follows: a photoresist layer is first coated on the second-type doped semiconductor layer 116, and then the region not covered by the photoresist layer is etched, wherein the etching method can be inductively-coupled plasma (ICP).

Figure 8D:
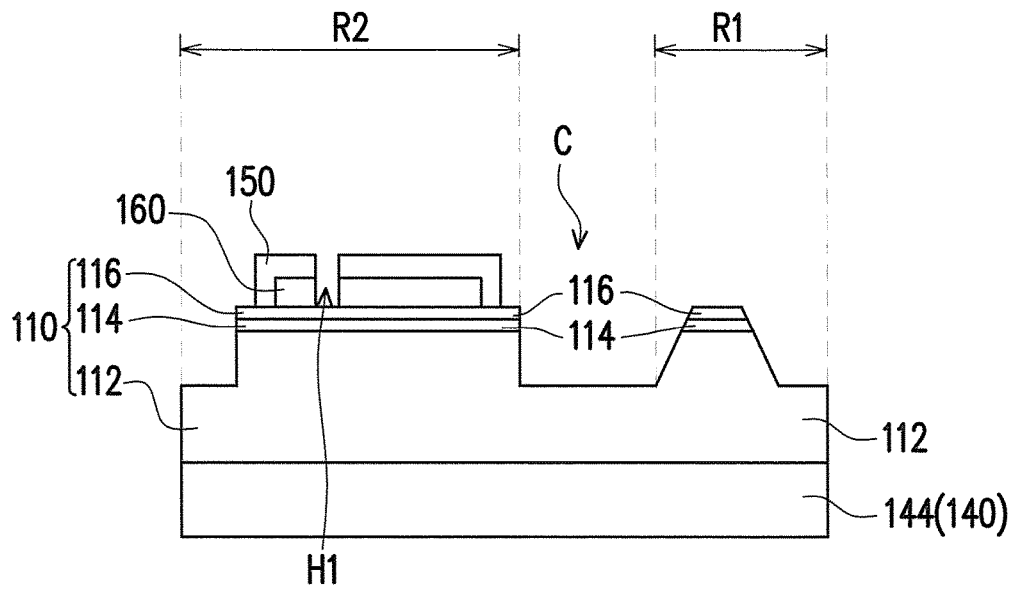

Next, referring to FIG. 8D, in the second region R2, a current-blocking layer 160 is formed on the second-type doped semiconductor layer 116. Next, a current-spreading layer 150 is formed on the second-type doped semiconductor layer 116, and the current-spreading layer 150 covers the current-blocking layer 160. The method of forming the current-blocking layer 160 and the current-spreading layer 150 is, for instance, a sputtering method. Next, a first opening H1 is formed in the second region R2. The first opening H1 passes through the current-blocking layer 160 and the current-spreading layer 150. The method of forming the first opening H1 is, for instance, an etching method.

Figure 8E:
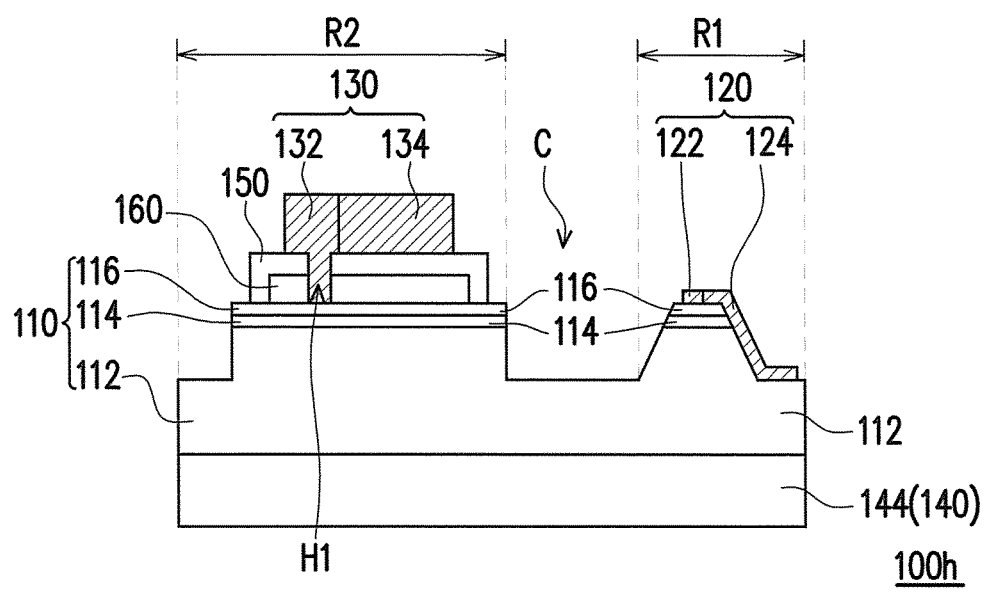

Lastly, referring to FIG. 8E, a first electrode 120 is formed in the first region R1. Specifically, the soldering portion 122 of the first electrode 120 is formed on the second-type doped semiconductor layer 116 in the first region R1, and the branch portion 124 of the first electrode 120 is formed on a portion of the upper surface of the second-type doped semiconductor layer 116, a side surface of the second-type doped semiconductor layer 116, and a side surface of the quantum well layer 114 in the first region R1, and the branch portion 124 of the first electrode 120 is extended to a portion of the upper surface of a portion of the first-type doped semiconductor layer 112. In the present embodiment, the method of forming (deposition) the first electrode 120 and the second electrode 130 can be plasma-enhanced chemical vapor deposition (PECVD), electron beam (e-beam), sputtering method, vacuum evaporation, or electroplating. At this point, the LED 100h is largely complete.

Ninth Embodiment

Figure 9A:
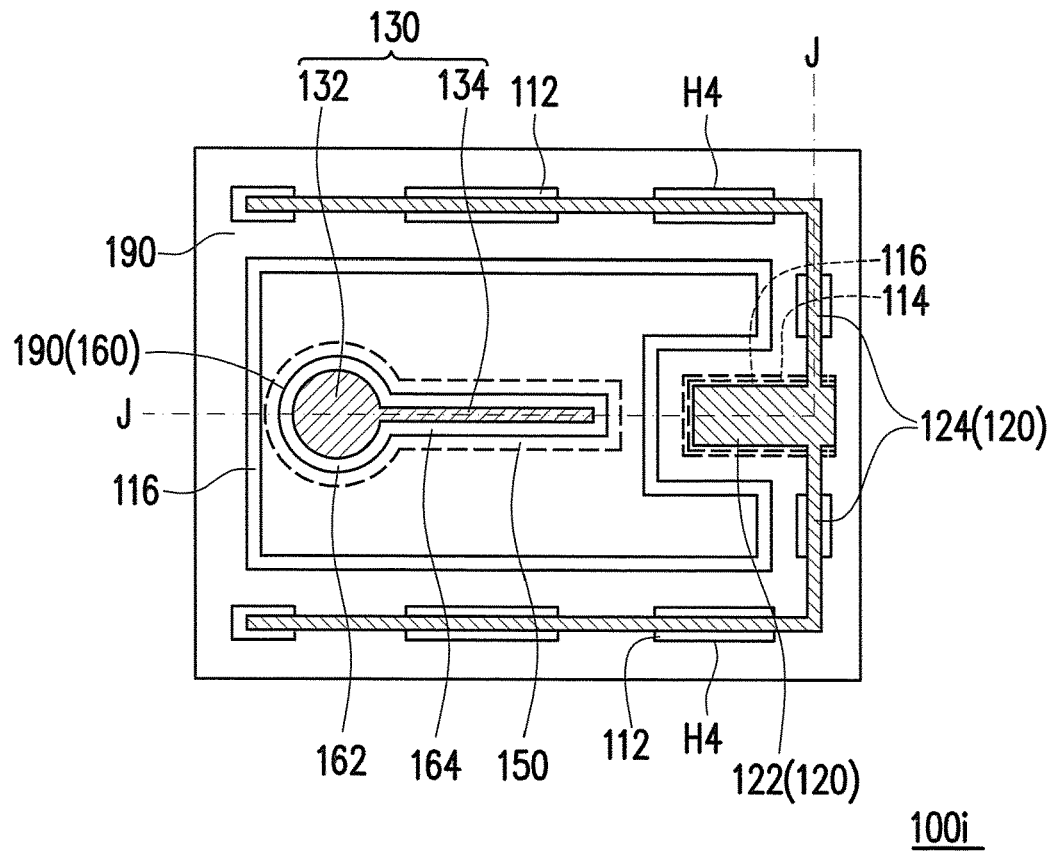
FIG. 9A and FIG. 9B respectively show a top schematic view and a cross-sectional schematic view of the LED of the ninth embodiment of the invention.
Figure 9B:
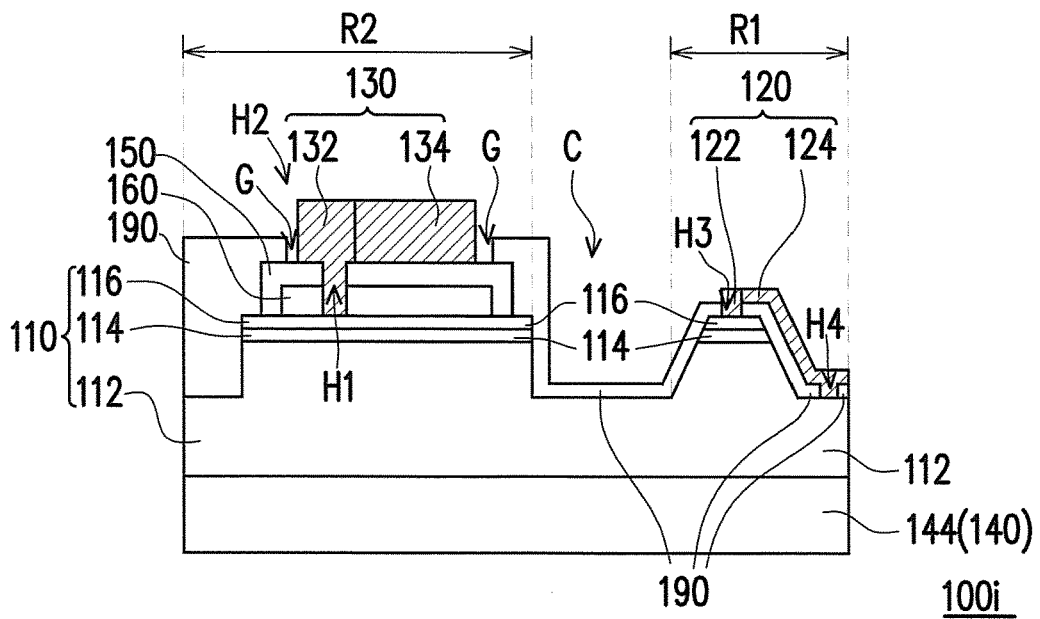

FIG. 9A is a top schematic view of the LED according to the ninth embodiment of the invention, and FIG. 9B is a cross-sectional schematic view of the LED of the ninth embodiment of the invention along line J-J. An LED 100i shown in FIG. 9A and FIG. 9B is similar to the LED 100h shown in FIG. 8A and FIG. 8B, and the components having the same reference numerals in the LED 100h and the LED 100a and relevant descriptions thereof are as provided for the LED 100h of the eighth embodiment and are not repeated herein. In the present embodiment, the main difference between the LED 100i and the LED 100h is: the LED 100 further includes an insulation layer 190. The insulation layer 190 covers a portion of the first-type doped semiconductor layer 112, the quantum well layer 114, and the second-type doped semiconductor layer 116. The insulation layer 190 has a second opening H2, a third opening H3, and at least one fourth opening H4. The second opening H2 is located in the second region R2 and connected to the first opening H1. The third opening H3 is located in the first region R1 and exposes a portion of the second-type doped semiconductor layer 116 in the first region R1, and the at least one fourth opening H4 is arranged along the extending direction of the branch portion 124 of the first electrode 120. In the present embodiment, the at least one fourth opening H4 is, for instance, a plurality of fourth openings H4, and in the other embodiments, the at least one fourth opening H4 can also be one fourth opening H4, and the invention is not limited thereto. Next, the second electrode 130 is disposed in the second opening H2 and the first opening H1. The soldering portion 122 of the first electrode 120 is disposed in the third opening H3, and the branch portion 124 of the first electrode 120 covers a portion of the insulation layer 190 and is extended into the at least one fourth opening H4.

In the present embodiment, in the second region R2, a gap G is between the second electrode 130 and the insulation layer 190. In the other embodiments, the second electrode 130 can also completely fill the second opening H2 and cover a portion of the insulation layer 190, and the invention is not limited thereto.

Figure 9C:
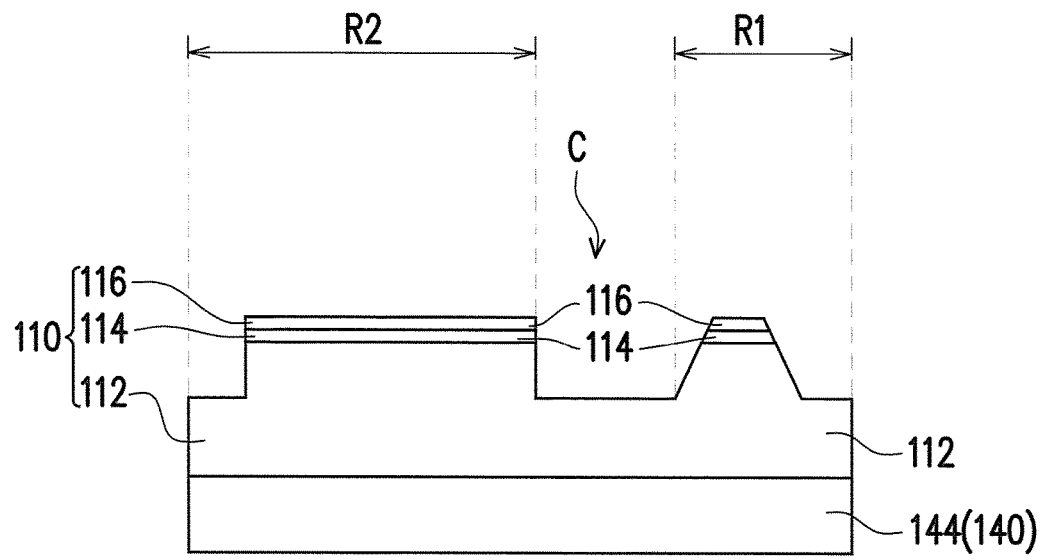
FIG. 9C to FIG. 9F are flow schematics of a manufacturing method of the LED according to the ninth embodiment of the invention.

FIG. 9C to FIG. 9F are flow schematics of a manufacturing method of the LED shown in FIG. 9A and FIG. 9B. Referring first to FIG. 9C, in the present embodiment, the manufacturing method of the LED 100i shown in FIG. 9A and FIG. 9B includes growing a semiconductor epitaxial layer 110 on a substrate 140, wherein the semiconductor epitaxial layer 110 has a first-type doped semiconductor layer 112, a quantum well layer 114, and a second-type doped semiconductor layer 116. Specifically, the first-type doped semiconductor layer 112 is formed on the substrate 140, the quantum well layer 114 is formed on the first-type doped semiconductor layer 112, and the second-type doped semiconductor layer 116 is formed on the quantum well layer 114. The method of growing the semiconductor epitaxial layer 110 adopts, for instance, a metal-organic chemical vapor deposition (MOCVD) method. Next, a portion of the first-type doped semiconductor layer 112, a portion of the quantum well layer 114, and a portion of the second-type doped semiconductor layer 116 are removed via etching and a portion of the first-type doped semiconductor layer 112 is exposed. Moreover, a recessed portion C is formed by etching to define a first region R1 and a second region R2. In the second region R2, the shape of the first-type doped semiconductor layer 112, the quantum well layer 114, and the second-type doped semiconductor layer 116 in this cross-section is, for instance, a rectangle, and can be a trapezoid in another embodiment. In the first region R1, the shape of the cross-section of the first-type doped semiconductor layer 112, the quantum well layer 114, and the second-type doped semiconductor layer 116 is, for instance, a trapezoid. The specific etching method is as follows: a photoresist layer is first coated on the second-type doped semiconductor layer 116, and then the region not covered by the photoresist layer is etched by using a photolithograph process, wherein the etching method can be inductively-coupled plasma (ICP).

Figure 9D:
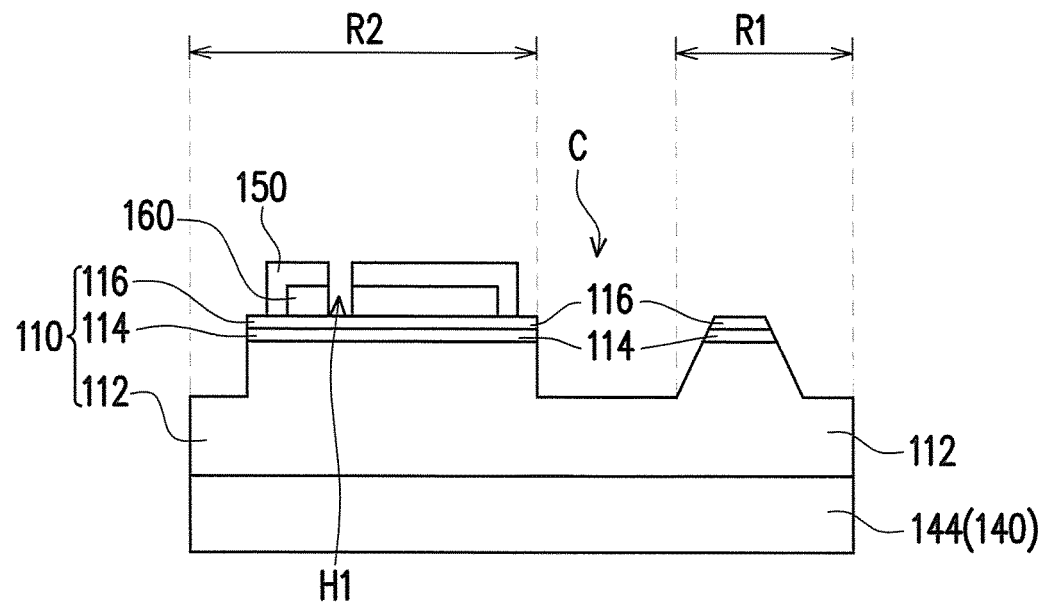

Next, referring to FIG. 9D, in the second region R2, a current-blocking layer 160 is formed on the second-type doped semiconductor layer 116. Next, a current-spreading layer 150 is formed on the second-type doped semiconductor layer 116, and the current-spreading layer 150 covers the current-blocking layer 160. The method of forming the current-blocking layer 160 and the current-spreading layer 150 is, for instance, a sputtering method. Next, a first opening H1 is formed in the second region R2. The first opening H1 passes through the current-blocking layer 160 and the current-spreading layer 150. The method of forming the first opening H1 is, for instance, an etching method.

Figure 9E:
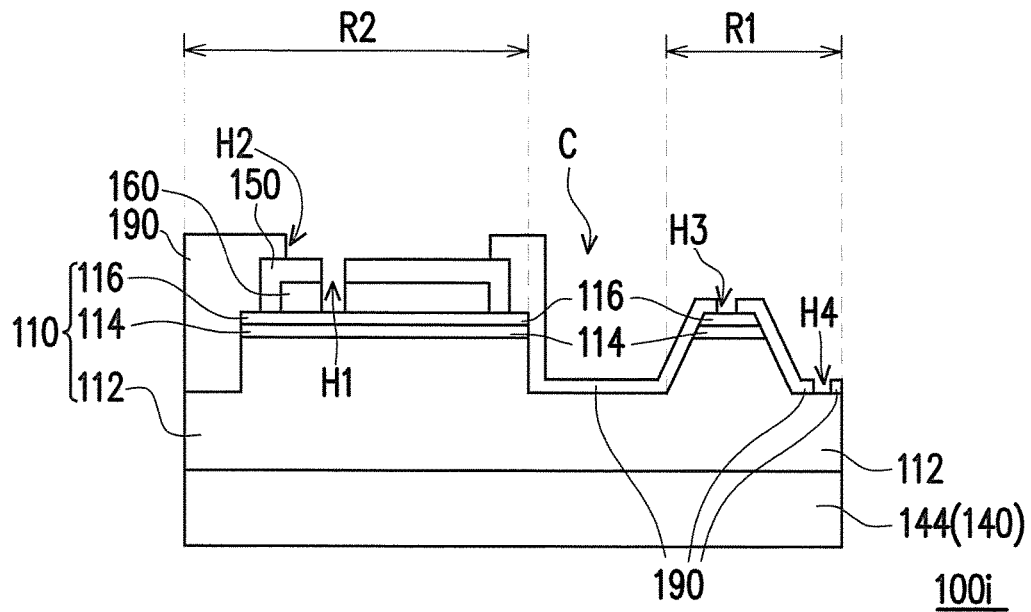

Next, referring to FIG. 9E, an insulation layer 190 is formed to cover a portion of the first-type doped semiconductor layer 112, the quantum well layer 114, and the second-type doped semiconductor layer 116. The insulation layer 190 respectively has a second opening H2, a third opening H3, and at least one fourth opening H4. The second opening H2 is located in the second region R2 and connected to the first opening H1. The third opening H3 is located in the first region R1 and exposes a portion of the second-type doped semiconductor layer 116 in the first region R1, and the at least one fourth opening H4 is arranged along the extending direction of the branch portion 124 of the first electrode 120.

Figure 9F:
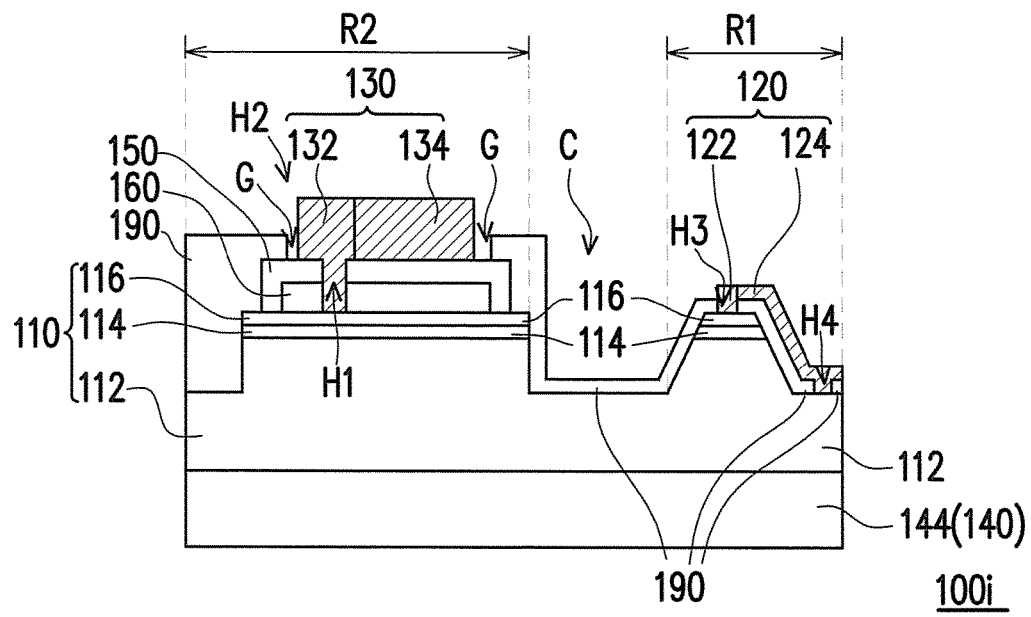

Lastly, referring to FIG. 9F, a first electrode 120 is formed in the first region R1, and a second electrode 130 is formed in the second region R2. Specifically, a soldering portion 122 of the first electrode 120 is formed on the second-type doped semiconductor layer 116 in the first region R1, and the soldering portion 122 is disposed in the third opening H3. The second electrode 130 is disposed in the second opening H2 and the first opening H1. In the present embodiment, the method of forming (deposition) the first electrode 120 and the second electrode 130 can be plasma-enhanced chemical vapor deposition (PECVD), electron beam (e-beam), sputtering method, vacuum evaporation, or electroplating. At this point, the LED 100i is largely complete.

Tenth Embodiment

Figure 10A:
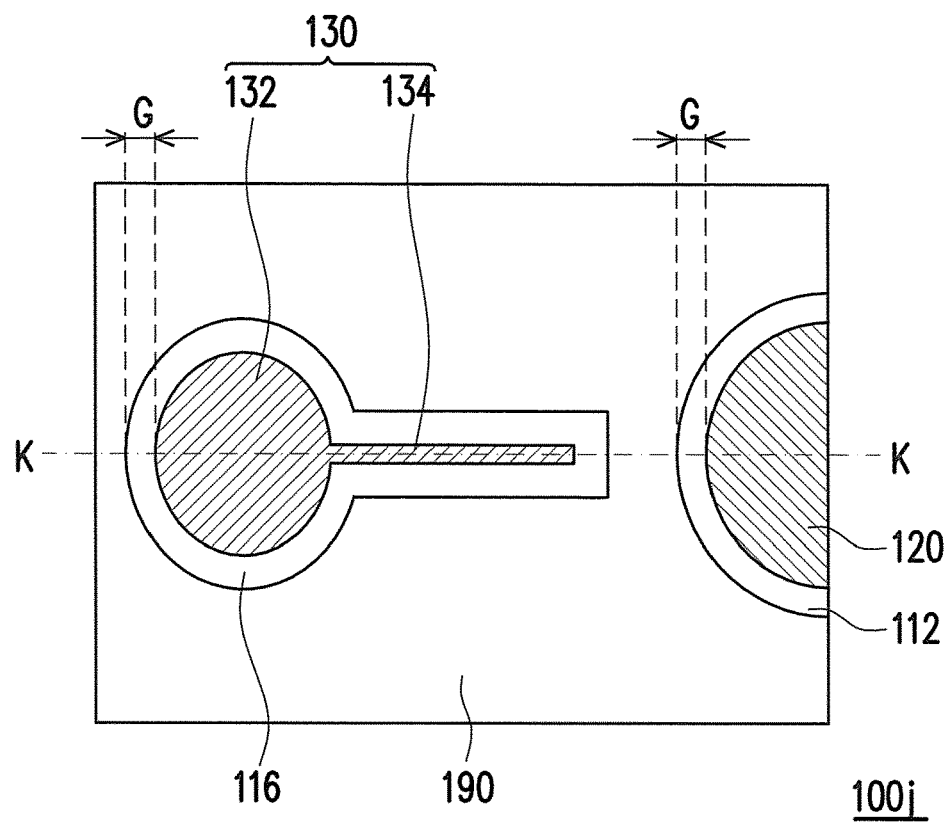
FIG. 10A and FIG. 10B respectively show a top schematic view and a cross-sectional schematic view of the LED of the tenth embodiment of the invention.
Figure 10B:
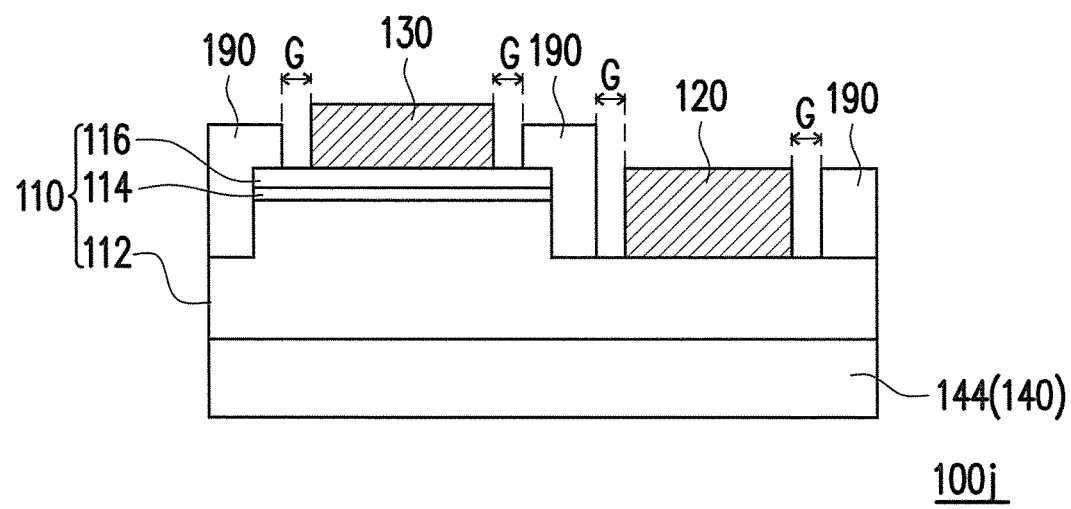

FIG. 10A is a top schematic view of the LED according to the tenth embodiment of the invention, and FIG. 10B is a cross-sectional schematic view of the LED of the tenth embodiment of the invention along line K-K. In the present embodiment, an LED 100j shown in FIG. 10A and FIG. 10B includes a semiconductor epitaxial layer 110, a first electrode 120, a second electrode 130, a substrate 140, and an insulation layer 190. The semiconductor epitaxial layer 110 includes a first-type doped semiconductor layer 112, a quantum well layer 114, and a second-type doped semiconductor layer 116, wherein the quantum well layer 114 is located between the first-type doped semiconductor layer 112 and the second-type doped semiconductor layer 116. The first electrode 120 is electrically connected to the first-type doped semiconductor layer 112, wherein the first electrode 120 includes a soldering portion 122 and a branch portion 124 extended from the soldering portion (not shown in FIG. 10A and FIG. 10B). The first electrode 120 is electrically connected to the first-type doped semiconductor layer 112. The second electrode 130 is electrically connected to the second-type doped semiconductor layer 116. The semiconductor epitaxial layer 110, the first electrode 120, and the second electrode 130 are disposed at the same side of the substrate 140. It should be mentioned that, FIG. 10A and FIG. 10B in the present embodiment are only exemplary illustrations, and the LEDs of the first embodiment to the seventh embodiment can be adopted. In particular, the insulation layer 190 covers a portion of the first-type doped semiconductor layer 112 and a portion of the second-type doped semiconductor layer 116, and a spacing G is respectively between the insulation layer 190 and the first electrode 120 and between the insulation layer 190 and the second electrode 130. It should be mentioned that, in the present embodiment, the values of the spacings between the first electrodes 120 and the insulation layer 190 are not necessarily the same, and the gaps G can also be different from one another, and the invention is not limited thereto.

In the present embodiment, the material of the insulation layer 190 includes a dielectric material such as silicon oxide (SiOx), silicon nitride (SiNx). In some embodiments, the material of the insulation layer 480 can also be other types of dielectric materials, and the invention is not limited thereto.

Based on the above, in the present embodiment, a gap G is respectively between the first electrode 120 and the second electrode 130 and the insulation layer 190. In other words, the electrodes and the insulation layer are not connected to each another. Therefore, when an external power supply provides a driving voltage to the LED 100j, the phenomenon of leakage current on the surface caused by current on the surface of the LED 100j flowing through the insulation layer 190 can be further prevented. Therefore, the LED 100j of the present embodiment can increase the probability of recombination of electrons and electron holes in the quantum well layer 114, and as a result the luminous efficiency of the LED 100j is further increased.

Based on the above, in the LED of an embodiment of the invention, non-Ohmic contact is formed at the interface of the soldering portion of the first electrode and the substrate or between the soldering portion of the first electrode and the second-type doped semiconductor layer. As a result, when the LED is in operation, since the resistance at the interface at which non-Ohmic contact is formed is greater, the current (or electron flow) provided by an external driving power supply to the LED less readily passes through the interface at which non-Ohmic contact is formed. Therefore, current (or electron flow) can move toward the branch portion away from the soldering portion of the first electrode, and current (or electron flow) can be uniformly distributed on the surface of the LED after spreading, such that the overall luminous efficiency of the LED is increased. Moreover, in an embodiment of the invention, an insulation layer is formed to provide a gap between the electrodes (first electrode and second electrode) and the insulation layer, and therefore the phenomenon of leakage current at the surface of the LED can be further reduced to increase the luminous efficiency of the LED.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A light-emitting diode (LED), comprising:
   a semiconductor epitaxial layer comprising a first-type doped semiconductor layer, a second-type doped semiconductor layer, and a quantum well layer, wherein the quantum well layer is located between the first-type doped semiconductor layer and the second-type doped semiconductor layer, a recessed portion is formed in the semiconductor epitaxial layer, the recessed portion separates the second-type doped semiconductor layer, the quantum well layer, and a portion of the first-type doped semiconductor layer and exposes the first-type doped semiconductor layer, and defines a first region and a second region on the semiconductor epitaxial layer, wherein the first region and the second region respectively contain a portion of the second-type doped semiconductor layer, a portion of the quantum well layer, and a portion of the first-type doped semiconductor layer and are connected to each other via the first-type doped semiconductor layer;
   a first electrode located in the first region and electrically connected to at least a portion of the first-type doped semiconductor layer and at least a portion of the second-type doped semiconductor layer, wherein the first electrode further comprises a soldering portion and a branch portion extended from the soldering portion, the soldering portion is disposed on a portion of the second-type doped semiconductor layer, and the branch portion is disposed on a portion of the first-type doped semiconductor layer; and
   a second electrode located in the second region and electrically connected to the second-type doped semiconductor layer,
   wherein the branch portion of the first electrode covers a portion of an upper surface of the second-type doped semiconductor layer, a side surface of the second-type doped semiconductor layer, a side surface of the quantum well layer, and an upper surface of a portion of the first-type doped semiconductor layer.

2. The LED of claim 1, further comprising:
   a current-blocking layer disposed on the second-type doped semiconductor layer in the second region, wherein the current-blocking layer comprises a main body and an extending portion extended from the main body; and
   a current-spreading layer disposed on the second-type doped semiconductor layer and the current-blocking layer.

3. The LED of claim 2, wherein the semiconductor epitaxial layer, the first electrode, the current-blocking layer, the current-spreading layer, and the second electrode are disposed at a same side of the substrate.

4. The LED of claim 2, wherein the second electrode is electrically connected to the second-type doped semiconductor layer via the current-spreading layer.

5. The LED of claim 2, wherein the current-blocking layer and the current-spreading layer further contain a first opening, and the first opening exposes a portion of the second-type doped semiconductor layer.

6. The LED of claim 5, further comprising an insulation layer covering a portion of the first-type doped semiconductor layer, the quantum well layer, and the second-type doped semiconductor layer.

7. The LED of claim 6, wherein the insulation layer respectively has a second opening, a third opening, and at least one fourth opening, the second opening is located in the second region and is connected to the first opening, the third opening is located in the first region and exposes a portion of the second-type doped semiconductor layer in the first region, and the at least one fourth opening exposing the first-type doped semiconductor is arranged along an extending direction of the branch portion of the first electrode.

8. The LED of claim 6, wherein the second electrode is disposed in the second opening and the first opening, the soldering portion of the first electrode is disposed in the third opening, and the branch portion of the first electrode covers a portion of the insulation layer and is extended into the at least one fourth opening.

9. The LED of claim 6, wherein a spacing is between the insulation layer and the second electrode.

10. The LED of claim 1, wherein in the first region, an area of the soldering portion of the first electrode is less than an area of the second-type doped semiconductor layer.

11. The LED of claim 1, wherein in the first region, a shape of a cross-section of the first-type doped semiconductor layer, the quantum well layer, and the second-type doped semiconductor layer is a trapezoid.

12. A light-emitting diode (LED), comprising:
a semiconductor epitaxial layer comprising a first-type doped semiconductor layer, a second-type doped semiconductor layer, and a quantum well layer, wherein the quantum well layer is located between the first-type doped semiconductor layer and the second-type doped semiconductor layer, a recessed portion is formed in the semiconductor epitaxial layer, the recessed portion separates the second-type doped semiconductor layer, the quantum well layer, and a portion of the first-type doped semiconductor layer and exposes the first-type doped semiconductor layer, and defines a first region and a second region on the semiconductor epitaxial layer, wherein the first region and the second region respectively contain a portion of the second-type doped semiconductor layer, a portion of the quantum well layer, and a portion of the first-type doped semiconductor layer and are connected to each other via the first-type doped semiconductor layer;
a first electrode located in the first region and electrically connected to at least a portion of the first-type doped semiconductor layer and at least a portion of the second-type doped semiconductor layer;
a second electrode located in the second region and electrically connected to the second-type doped semiconductor layer;
a current-blocking layer disposed on the second-type doped semiconductor layer in the second region, wherein the current-blocking layer comprises a main body and an extending portion extended from the main body;
a current-spreading layer disposed on the second-type doped semiconductor layer and the current-blocking layer, and
an insulation layer covering a portion of the first-type doped semiconductor layer, the quantum well layer, and the second-type doped semiconductor layer.

13. The LED of claim 12, wherein the semiconductor epitaxial layer, the first electrode, the current-blocking layer, the current-spreading layer, and the second electrode are disposed at a same side of the substrate.

14. The LED of claim 12, wherein the second electrode is electrically connected to the second-type doped semiconductor layer via the current-spreading layer.

15. The LED of claim 12, wherein the current-blocking layer and the current-spreading layer further contain a first opening, and the first opening exposes a portion of the second-type doped semiconductor layer.

16. The LED of claim 12, wherein the first electrode further comprises a soldering portion and a branch portion extended from the soldering portion, the soldering portion is disposed on a portion of the second-type doped semiconductor layer, and the branch portion is disposed on a portion of the first-type doped semiconductor layer,
wherein in the first region, an area of the soldering portion of the first electrode is less than an area of the second-type doped semiconductor layer.

17. The LED of claim 12, wherein the first electrode further comprises a soldering portion and a branch portion extended from the soldering portion, the soldering portion is disposed on a portion of the second-type doped semiconductor layer, and the branch portion is disposed on a portion of the first-type doped semiconductor layer,
wherein the branch portion of the first electrode covers a portion of an upper surface of the second-type doped semiconductor layer, a side surface of the second-type doped semiconductor layer, a side surface of the quantum well layer, and an upper surface of a portion of the first-type doped semiconductor layer.

18. The LED of claim 12, wherein in the first region, a shape of a cross-section of the first-type doped semiconductor layer, the quantum well layer, and the second-type doped semiconductor layer is a trapezoid.

19. The LED of claim 12, wherein the insulation layer respectively has a second opening, a third opening, and at least one fourth opening, the second opening is located in the second region and is connected to the first opening, the third opening is located in the first region and exposes a portion of the second-type doped semiconductor layer in the first region, and the at least one fourth opening exposing the first-type doped semiconductor is arranged along an extending direction of the branch portion of the first electrode.

20. The LED of claim 12, wherein the second electrode is disposed in the second opening and the first opening, the soldering portion of the first electrode is disposed in the third opening, and the branch portion of the first electrode covers a portion of the insulation layer and is extended into the at least one fourth opening.

21. The LED of claim 12, wherein a spacing is between the insulation layer and the second electrode.

22. A light-emitting diode (LED), comprising:
a semiconductor epitaxial layer comprising a first-type doped semiconductor layer, a second-type doped semiconductor layer, and a quantum well layer, wherein the quantum well layer is located between the first-type doped semiconductor layer and the second-type doped semiconductor layer, a recessed portion is formed in the semiconductor epitaxial layer, the recessed portion separates the second-type doped semiconductor layer, the quantum well layer, and a portion of the first-type doped semiconductor layer and exposes the first-type doped semiconductor layer, and defines a first region and a second region on the semiconductor epitaxial layer, wherein the first region and the second region respectively contain a portion of the second-type doped semiconductor layer, a portion of the quantum well layer, and a portion of the first-type doped semiconductor layer and are connected to each other via the first-type doped semiconductor layer;
a first electrode located in the first region and electrically connected to at least a portion of the first-type doped semiconductor layer and at least a portion of the second-type doped semiconductor layer, the first electrode comprising a soldering portion and a branch portion extended from the soldering portion;
a second electrode located in the second region and electrically connected to the second-type doped semiconductor layer; and
an insulation layer covering a portion of the first-type doped semiconductor layer, the quantum well layer, and the second-type doped semiconductor layer,
wherein the insulation layer respectively has a second opening, a third opening, and at least one fourth opening, the second opening is located in the second region and exposes the second-type doped semiconductor layer, the third opening is located in the first region and exposes a portion of the second-type doped semiconductor layer in the first region, and the at least one fourth opening exposing the first-type doped semiconductor is arranged along an extending direction of the branch portion of the first electrode.

23. The LED of claim 22, wherein the first electrode further comprises a soldering portion and a branch portion extended from the soldering portion, the soldering portion is disposed on a portion of the second-type doped semiconductor layer, and the branch portion is disposed on a portion of the first-type doped semiconductor layer,
wherein in the first region, an area of the soldering portion of the first electrode is less than an area of the second-type doped semiconductor layer.

24. The LED of claim 23, wherein the soldering portion is disposed on a portion of the second-type doped semiconductor layer, and the branch portion is disposed on a portion of the first-type doped semiconductor layer,
wherein the branch portion of the first electrode covers a portion of an upper surface of the second-type doped semiconductor layer, a side surface of the second-type doped semiconductor layer, a side surface of the quantum well layer, and an upper surface of a portion of the first-type doped semiconductor layer.

25. The LED of claim 22, wherein the second electrode is disposed in the second opening, the soldering portion of the first electrode is disposed in the third opening, and the branch portion of the first electrode covers a portion of the insulation layer and is extended into the at least one fourth opening.

26. The LED of claim 22, wherein a spacing is between the insulation layer and the second electrode.

27. The LED of claim 22, further comprising:
a current-blocking layer disposed on the second-type doped semiconductor layer in the second region, wherein the current-blocking layer comprises a main body and an extending portion extended from the main body; and
a current-spreading layer disposed on the second-type doped semiconductor layer and the current-blocking layer,
wherein the semiconductor epitaxial layer, the first electrode, the current-blocking layer, the current-spreading layer, and the second electrode are disposed at a same side of the substrate.

28. The LED of claim 22, further comprising:
a current-blocking layer disposed on the second-type doped semiconductor layer in the second region, wherein the current-blocking layer comprises a main body and an extending portion extended from the main body; and
a current-spreading layer disposed on the second-type doped semiconductor layer and the current-blocking layer,
wherein the second electrode is electrically connected to the second-type doped semiconductor layer via the current-spreading layer.

29. The LED of claim 25, further comprising:
a current-blocking layer disposed between the second electrode and the second-type doped semiconductor layer in the second region, wherein the current-blocking layer comprises a main body and an extending portion extended from the main body; and
a current-spreading layer disposed between the second-type doped semiconductor layer and the current-blocking layer,
wherein the current-blocking layer and the current-spreading layer further contain a first opening connected to the second opening, and the first opening exposes a portion of the second-type doped semiconductor layer and the second electrode is further filled in the first opening.

30. The LED of claim 22, wherein in the first region, a shape of a cross-section of the first-type doped semiconductor layer, the quantum well layer, and the second-type doped semiconductor layer is a trapezoid.

31. A light-emitting diode (LED), comprising:
a semiconductor epitaxial layer comprising a first-type doped semiconductor layer, a second-type doped semiconductor layer, and a quantum well layer, wherein the quantum well layer is located between the first-type doped semiconductor layer and the second-type doped semiconductor layer, a recessed portion is formed in the semiconductor epitaxial layer, the recessed portion separates the second-type doped semiconductor layer, the quantum well layer, and a portion of the first-type doped semiconductor layer and exposes the first-type doped semiconductor layer, and defines a first region and a second region on the semiconductor epitaxial layer, wherein the first region and the second region respectively contain a portion of the second-type doped semiconductor layer, a portion of the quantum well layer, and a portion of the first-type doped semiconductor layer and are connected to each other via the first-type doped semiconductor layer;
a first electrode located in the first region and electrically connected to at least a portion of the first-type doped semiconductor layer and at least a portion of the second-type doped semiconductor layer, wherein the first electrode further comprises a soldering portion and a branch portion extended from the soldering portion, the soldering portion is disposed on a portion of the second-type doped semiconductor layer, and the branch portion is disposed on a portion of the first-type doped semiconductor layer;

a second electrode located in the second region and electrically connected to the second-type doped semiconductor layer;

a current-blocking layer disposed on the second-type doped semiconductor layer in the second region, wherein the current-blocking layer comprises a main body and an extending portion extended from the main body; and a current-spreading layer disposed on the second-type doped semiconductor layer and the current-blocking layer.

32. The LED of claim 31, wherein the current-blocking layer and the current-spreading layer further contain a first opening, and the first opening exposes a portion of the second-type doped semiconductor layer.

33. The LED of claim 32, further comprising an insulation layer covering a portion of the first-type doped semiconductor layer, the quantum well layer, and the second-type doped semiconductor layer.

34. The LED of claim 33, wherein the insulation layer respectively has a second opening, a third opening, and at least one fourth opening, the second opening is located in the second region and is connected to the first opening, the third opening is located in the first region and exposes a portion of the second-type doped semiconductor layer in the first region, and the at least one fourth opening exposing the first-type doped semiconductor is arranged along an extending direction of the branch portion of the first electrode.

35. The LED of claim 33, wherein the second electrode is disposed in the second opening and the first opening, the soldering portion of the first electrode is disposed in the third opening, and the branch portion of the first electrode covers a portion of the insulation layer and is extended into the at least one fourth opening.

36. The LED of claim 33, wherein a spacing is between the insulation layer and the second electrode.

37. The LED of claim 31, wherein in the first region, an area of the soldering portion of the first electrode is less than an area of the second-type doped semiconductor layer.

38. The LED of claim 31, wherein the semiconductor epitaxial layer, the first electrode, the current-blocking layer, the current-spreading layer, and the second electrode are disposed at a same side of the substrate.

39. The LED of claim 31, wherein the second electrode is electrically connected to the second-type doped semiconductor layer via the current-spreading layer.

40. The LED of claim 31, wherein in the first region, a shape of a cross-section of the first-type doped semiconductor layer, the quantum well layer, and the second-type doped semiconductor layer is a trapezoid.

* * * * *